(12) United States Patent
Abraham et al.

(10) Patent No.: US 11,482,404 B2
(45) Date of Patent: *Oct. 25, 2022

(54) ELECTRICALLY AND MAGNETICALLY ENHANCED IONIZED PHYSICAL VAPOR DEPOSITION UNBALANCED SPUTTERING SOURCE

(71) Applicant: IonQuest LLC, Mansfield, MA (US)

(72) Inventors: Bassam Hanna Abraham, Millis, MA (US); Roman Chistyakov, North Andover, MA (US)

(73) Assignee: IonQuest Corp., Milford, MA (US)

( * ) Notice: Subject to any disclaimer, the term of this patent is extended or adjusted under 35 U.S.C. 154(b) by 466 days.

This patent is subject to a terminal disclaimer.

(21) Appl. No.: 16/063,283

(22) PCT Filed: Dec. 20, 2016

(86) PCT No.: PCT/US2016/067850
§ 371 (c)(1),
(2) Date: Jun. 17, 2018

(87) PCT Pub. No.: WO2017/112700
PCT Pub. Date: Jun. 29, 2017

(65) Prior Publication Data
US 2018/0374689 A1    Dec. 27, 2018

Related U.S. Application Data

(63) Continuation-in-part of application No. 15/260,857, filed on Sep. 9, 2016, now abandoned.
(Continued)

(51) Int. Cl.
*H01J 37/34*    (2006.01)
*H01J 37/32*    (2006.01)
(Continued)

(52) U.S. Cl.
CPC ........ *H01J 37/345* (2013.01); *C23C 14/0611* (2013.01); *C23C 14/345* (2013.01);
(Continued)

(58) Field of Classification Search
CPC .. H01J 37/3467; H01J 37/345; H01J 37/3435; H01J 37/3426; H01J 37/3423;
(Continued)

(56) References Cited

U.S. PATENT DOCUMENTS

| 3,767,551 A | 10/1973 | Lang, Jr. et al. |
| 4,588,490 A | 5/1986 | Cuomo et al. |

(Continued)

FOREIGN PATENT DOCUMENTS

| WO | 2014/053209 A1 | 4/2014 |
| WO | 2016/028640 A1 | 2/2016 |

(Continued)

OTHER PUBLICATIONS

Non-Final Office Action received for U.S. Appl. No. 15/260,857 dated Mar. 9, 2018, 38 pages.
(Continued)

*Primary Examiner* — Michael A Band
(74) *Attorney, Agent, or Firm* — FisherBroyles, LLP

(57) ABSTRACT

An electrically and magnetically enhanced ionized physical vapor deposition (I-PVD) magnetron apparatus and method is provided for sputtering material from a cathode target on a substrate, and in particular, for sputtering ceramic and diamond-like coatings. The electrically and magnetically enhanced magnetron sputtering source has unbalanced magnetic fields that couple the cathode target and additional electrode together. The additional electrode is electrically isolated from ground and connected to a power supply that can generate positive, negative, or bipolar high frequency voltages, and is preferably a radio frequency (RF) power
(Continued)

supply. RF discharge near the additional electrode increases plasma density and a degree of ionization of sputtered material atoms.

22 Claims, 23 Drawing Sheets

Related U.S. Application Data

(60) Provisional application No. 62/270,356, filed on Dec. 21, 2015.

(51) Int. Cl.
*C23C 14/35* (2006.01)
*C23C 14/34* (2006.01)
*C23C 14/06* (2006.01)

(52) U.S. Cl.
CPC ...... *C23C 14/3407* (2013.01); *C23C 14/3485* (2013.01); *C23C 14/352* (2013.01); *C23C 14/354* (2013.01); *H01J 37/321* (2013.01); *H01J 37/32816* (2013.01); *H01J 37/3405* (2013.01); *H01J 37/3423* (2013.01); *H01J 37/3426* (2013.01); *H01J 37/3435* (2013.01); *H01J 37/3467* (2013.01)

(58) Field of Classification Search
CPC ............ H01J 37/3405; H01J 37/32816; H01J 37/321; C23C 14/354; C23C 14/352; C23C 14/3485; C23C 14/345; C23C 14/3407

See application file for complete search history.

(56) References Cited

U.S. PATENT DOCUMENTS

| | | | |
|---|---|---|---|
| 5,178,739 A | 1/1993 | Barnes et al. | |
| 5,227,211 A * | 7/1993 | Eltoukhy | C23C 14/0605 |
| | | | 428/336 |
| 5,482,611 A | 1/1996 | Helmer et al. | |
| 5,651,865 A | 7/1997 | Sellers | |
| 6,024,843 A * | 2/2000 | Anderson | C23C 14/35 |
| | | | 204/192.12 |
| 6,077,403 A | 6/2000 | Kobayashi et al. | |
| 6,216,632 B1 | 4/2001 | Wickramanayaka | |
| 6,903,511 B2 | 6/2005 | Chistyakov | |
| 7,095,179 B2 * | 8/2006 | Chistyakov | C23C 14/35 |
| | | | 118/723 R |
| 7,327,089 B2 | 2/2008 | Madocks | |
| 7,898,183 B2 | 3/2011 | Chistyakov et al. | |
| 8,696,875 B2 * | 4/2014 | Ding | H01L 21/76871 |
| | | | 204/192.12 |
| 9,267,200 B2 | 2/2016 | Krassnitzer et al. | |
| 9,624,571 B2 * | 4/2017 | Arndt | C23C 14/0635 |
| 9,771,647 B1 | 9/2017 | Scobey et al. | |
| 9,951,414 B2 | 4/2018 | Chistyakov | |
| 10,227,691 B2 | 3/2019 | Abraham et al. | |
| 10,227,692 B2 | 3/2019 | Chistyakov et al. | |
| 10,480,063 B2 | 11/2019 | Chistyakov et al. | |
| 10,913,998 B2 * | 2/2021 | Chistyakov | H01J 37/3452 |
| 10,957,519 B2 * | 3/2021 | Chistyakov | C23C 16/5093 |
| 2001/0050220 A1 * | 12/2001 | Chiang | C23C 14/358 |
| | | | 204/192.12 |
| 2004/0089541 A1 | 5/2004 | Matsumoto et al. | |
| 2004/0095497 A1 | 5/2004 | Compton et al. | |
| 2004/0227470 A1 | 11/2004 | Benveniste et al. | |
| 2006/0066248 A1 | 3/2006 | Chistyakov | |
| 2006/0278521 A1 | 12/2006 | Stowell | |
| 2006/0290399 A1 | 12/2006 | MacDougall et al. | |
| 2008/0190760 A1 | 8/2008 | Tang et al. | |
| 2009/0321249 A1 * | 12/2009 | Chistyakov | C23C 14/352 |
| | | | 204/192.16 |
| 2011/0011737 A1 | 1/2011 | Wu et al. | |
| 2014/0041800 A1 | 2/2014 | Okuyama et al. | |
| 2014/0305795 A1 * | 10/2014 | Bardos | H01J 37/3405 |
| | | | 204/298.16 |
| 2015/0348773 A1 * | 12/2015 | Zhu | H01J 37/3426 |
| | | | 438/503 |
| 2017/0178878 A1 | 6/2017 | Abraham et al. | |
| 2017/0178912 A1 | 6/2017 | Chistyakov et al. | |
| 2018/0374688 A1 | 12/2018 | Chistyakov et al. | |
| 2019/0249293 A1 | 8/2019 | Abraham et al. | |
| 2019/0256969 A1 | 8/2019 | Chistyakov et al. | |
| 2019/0271070 A1 | 9/2019 | Abraham et al. | |
| 2019/0316249 A1 | 10/2019 | Abraham et al. | |
| 2020/0176234 A1 | 6/2020 | Abraham et al. | |
| 2021/0102284 A1 | 4/2021 | Abraham et al. | |
| 2021/0115552 A1 | 4/2021 | Abraham et al. | |
| 2021/0115553 A1 | 4/2021 | Abraham | |
| 2021/0317569 A1 | 10/2021 | Abraham | |

FOREIGN PATENT DOCUMENTS

| | | |
|---|---|---|
| WO | 2017/112696 A1 | 6/2017 |
| WO | 2017/112700 A1 | 6/2017 |
| WO | 2018/186901 A1 | 10/2018 |

OTHER PUBLICATIONS

Final Office Action received for U.S. Appl. No. 15/260,857 dated Nov. 19, 2018, 16 pages.
Non-Final Office Action received for U.S. Appl. No. 15/260,841 dated Jan. 9, 2019, 8 pages.
Notice of Allowance received for U.S. Appl. No. 15/260,841 dated May 28, 2019, 24 pages.
International Search Report and Written Opinion received for PCT Application Serial No. PCT/US2017/048438 dated Nov. 3, 2017, 10 pages.
Non-Final Office Action received for U.S. Appl. No. 15/261,119 dated Jun. 26, 2017, 14 pages.
Final Office Action received for U.S. Appl. No. 15/261,119 dated Oct. 30, 2017, 11 pages.
Notice of Allowance received for U.S. Appl. No. 15/261,119 dated Jan. 26, 2018, 14 pages.
Non-Final Office Action received for U.S. Appl. No. 15/917,046 dated Jun. 22, 2018, 17 pages.
Notice of Allowance received for U.S. Appl. No. 15/917,046 dated Oct. 29, 2018, 19 pages.
Non-Final Office Action received for U.S. Appl. No. 15/261,197 dated Jun. 18, 2018, 14 pages.
Notice of Allowance received for U.S. Appl. No. 15/261,197 dated Oct. 31, 2018, 18 pages.
International Search Report and Written Opinion received for PCT Application Serial No. PCT/US2016/067850 dated Mar. 9, 2017, 7 pages.
International Preliminary Report on Patentability received for PCT Application Serial No. PCT/US2016/067850 dated Jul. 5, 2018, 7 pages.
Wang et al., "Hollow cathode magnetron", Journal of Vacuum Science & Technology A, vol. 17, No. 1, 1999, pp. 77-82.
International Search Report and Written Opinion received for PCT Application Serial No. PCT/US2016/067838 dated Mar. 16, 2017, 7 pages.
International Preliminary Report on Patentability received for PCT Application Serial No. PCT/US2016/067838 dated Jul. 5, 2018, 6 pages.
Abraham et al., "Electrically and Magnetically Enhanced Ionized Physical Vapor Deposition Unbalanced Sputtering Source", U.S. Appl. No. 16/284,327 dated Feb. 25, 2019, 114 pages.
Abraham et al., "Electrically and Magnetically Enhanced Ionized Physical Vapor Deposition Unbalanced Sputtering Source", U.S. Appl. No. 16/400,539 dated May 1, 2019, 64 pages.
Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 32 pages.

(56) References Cited

OTHER PUBLICATIONS

Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.
Abraham et al., "High-Power Resonance Pulse Ac Hedp Sputtering Source And Method For Material Processing", U.S. Appl. No. 16/025,928 dated Jul. 2, 2018, 76 pages.
Ulf, et al. "Ionized physical vapor deposition (IPVD): A review of technology and applications"; Article in Thin Solid Films, Aug. 14, 2006; Postprint available: Linkoping University E-Press: http://run.kb.se/resolve?urn=urn:nbn:se:liu:diva-10434; 61 pages.
Non-Final Office Action received for U.S. Appl. No. 16/025,928 dated Sep. 25, 2020, 24 pages.
Non-Final Office Action received for U.S. Appl. No. 16/261,514 dated Jun. 29, 2020, 26 pages.
Notice of Allowance received for U.S. Appl. No. 16/261,514 dated Oct. 9, 2020, 81 pages.
Non-Final Rejection received for U.S. Appl. No. 16/063,284 dated Jan. 30, 2020, 26 pages.
Non-Final Rejection received for U.S. Appl. No. 16/063,284 dated May 20, 2020, 12 pages.
Notice of Allowance received for U.S. Appl. No. 16/063,284 dated Dec. 17, 2020, 36 pages.
Non-Final Rejection received for U.S. Appl. No. 16/261,516 dated Jun. 29, 2020, 28 pages.
Notice of Allowance received for U.S. Appl. No. 16/261,516 dated Oct. 19, 2020, 24 pages.
International Preliminary Report on Patentability received for PCT Application Serial No. PCT/US2017/048438 dated Oct. 17, 2019, 8 pages.
Abraham et al., "Magnetically Enhanced High Density Plasma-Chemical Vapor Deposition Plasma Source for Depositing Diamond and Diamond-Like Films", U.S. Appl. No. 17/124,749, filed Dec. 17, 2020, 62 pages.
Abraham et al., "Magnetically Enhanced High Density Plasma-Chemical Vapor Deposition Plasma Source for Depositing Diamond and Diamond-Like Films", U.S. Appl. No. 17/124,691, filed Dec. 17, 2020, 63 pages.
Abraham, Bassam Hanna, "Magnetically Enhanced High Density Plasma-Chemical Vapor Deposition Plasma Source for Depositing Diamond and Diamond-Like Films", U.S. Appl. No. 17/127,527, filed Dec. 18, 2020, 172 pages.
Abraham, Bassam Hanna, "Magnetically Enhanced High Density Plasma-Chemical Vapor Deposition Plasma Source for Depositing Diamond and Diamond-Like Films", U.S. Appl. No. 17/352,168, filed Jun. 18, 2021, 172 pages.
Non-Final Office Action received for U.S. Appl. No. 16/400,539 dated Sep. 23, 2021, 38 pages.
Non-Final Office Action received for U.S. Appl. No. 16/284,327 dated Sep. 15, 2021, 42 pages.
Non-Final Office Action received for U.S. Appl. No. 17/124,691 dated Nov. 1, 2021, 42 pages.
Notice of Allowance received for U.S. Appl. No. 16/400,539 dated Oct. 8, 2021, 13 pages.
Non-Final Office Action received for U.S. Appl. No. 17/124,749 dated Nov. 5, 2021, 44 pages.

\* cited by examiner

ELECTRICALLY AND MAGNETICALLY ENHANCED IONIZED PHYSICAL VAPOR DEPOSITION UNBALANCED SPUTTERING SOURCE

CROSS-REFERENCE TO RELATED APPLICATIONS

This application is a National Stage application of International Application No. PCT/US2016/067850, filed Dec. 20, 2016, which is a continuation-in-part of U.S. application Ser. No. 15/260,857, filed Sep. 9, 2016, and claims the benefit of U.S. Provisional Application No. 62/270,356, filed Dec. 21, 2015, the disclosures of which are incorporated herein by reference in their entireties. U.S. application Ser. No. 15/260,841, filed Sep. 9, 2016, entitled "Capacitive Coupled Plasma Source for Sputtering and Resputtering", U.S. application Ser. No. 15/261,119, filed Sep. 9, 2016, entitled "Magnetically Enhanced High Density Plasma-Chemical Vapor Deposition Plasma Source for Depositing Diamond and Diamond-Like Films", and U.S. application Ser. No. 15/261,197, filed Sep. 9, 2016, entitled "Magnetically Enhanced Low Temperature-High Density Plasma-Chemical Vapor Deposition Plasma Source for Depositing Diamond and Diamond Like Films" filed concurrently herewith are incorporated herein by reference in their entireties.

BACKGROUND

Field

The disclosed embodiments generally relate to an ionized physical vapor deposition (I-PVD) apparatus and method for sputtering target material on a surface of a substrate. In particular, the disclosed embodiments relate to an apparatus and method of generating high density capacitive coupled plasma (CCP) for sputtering applications in addition to a cathode sputtering target discharge. The disclosed embodiments also relate to electrically and magnetically enhanced unbalanced magnetron or non-magnetron sputtering apparatuses and methods.

Related Art

An ionized physical vapor deposition (I-PVD) sputtering and resputtering process can be performed in the same process module in the presence of an additional inductively coupled plasma (ICP) source. An example of such an apparatus and process is described in U.S. Publication No. 2008/0190760A1, which is incorporated herein by reference in its entirety. The I-PVD sputtering source is a magnetron sputtering source, in which magnetic field lines terminate on a target surface. The resputtering process, which is sputter etching, can be performed with argon gas ions or sputtered copper ions. In order to increase ionization of the gas and sputtered material ions, an ICP coil is positioned in a vacuum chamber between a magnetron sputtering source and a substrate.

SUMMARY

The disclosed embodiments relate to an electrically and magnetically enhanced I-PVD unbalanced magnetron and non-magnetron apparatus and method for sputtering. Magnetic field geometry of the electrically and magnetically enhanced unbalanced magnetron sputtering source has an unbalanced magnetron configuration on a cathode target surface. Magnetic field lines that form a magnetron configuration on the cathode target surface are unbalanced from the center. In some embodiments, magnetic field lines are unbalanced from the edges. The unbalanced magnetic field lines are terminated on magnet assembly positioned inside an additional electrode that is electrically isolated from ground and positioned around the cathode target. The additional electrode is connected to a power supply that can generate a positive, negative or high frequency bipolar voltage with a frequency in the range of 100 KHz to 100 MHz. In some embodiments, the additional electrode is connected to the power supply that generates an RF voltage. In some embodiments, the additional electrode can be made from cathode target material. In some embodiments, the additional electrode is not connected to any power supply and has a floating potential. In some embodiments, at least a portion of the magnetic field lines passing the gap are positioned adjacent to the additional electrode prior to terminating on the magnets. The gap can be formed between the anode and additional to the cathode target gap cathode. The gap cathode can be connected with an RF power supply. The RF power supply can generate voltage oscillations with a frequency are in the range of 100 kHz to 100 MHz. The gap cathode can be grounded through an inductor to eliminate negative voltage bias generated by RF discharge. In some embodiments, magnetic field geometry of the electrically and magnetically enhanced sputtering source does not form a magnetron configuration on a cathode target surface. In this case, magnetic field lines on the cathode target surface are substantially perpendicular to the cathode target surface. In some embodiments, the additional electrode magnet assembly forms a cusp magnetic field. In some embodiments, the additional electrode magnet assembly forms a cusp magnetic field in the gap.

The electrically and magnetically enhanced I-PVD unbalanced sputtering source according to the disclosed embodiments includes a cathode target assembly connected to the power supply, an additional electrode assembly electrically isolated from ground, a power supply connected to the additional electrode assembly, a first additional electrode magnet assembly magnetically coupling the additional electrode assembly and the cathode target, a stationary or rotating cathode magnet assembly that generates an unbalanced magnetron magnetic field configuration on the target surface, an anode that is connected to ground, and a flowing liquid that cools and controls the temperature of the cathode.

The magnetically and electrically enhanced I-PVD unbalanced sputtering source may include: a second additional electrode magnet assembly, an electrical circuit that has at least one inductor connected between an additional electrode and ground, and an electrical circuit that has at least one inductor connected between a cathode target assembly and ground, as well as a gap that has a gap cathode and positioned around the additional electrode.

The electrically and magnetically enhanced I-PVD unbalanced magnetron sputtering apparatus includes an electrically and magnetically enhanced I-PVD unbalanced magnetron sputtering source, vacuum chamber, substrate holder, substrate, feed gas mass flow controller, and a vacuum pump.

The electrically and magnetically enhanced I-PVD unbalanced magnetron sputtering apparatus may include a substrate heater, controller, computer, feed gas activation source, substrate bias power supply, and an additional electrically and magnetically enhanced I-PVD unbalanced magnetron sputtering source.

A method of providing electrically and magnetically enhanced I-PVD unbalanced magnetron sputtering includes positioning an electrically and magnetically enhanced I-PVD unbalanced magnetron sputtering source inside a vacuum chamber, positioning a substrate on the substrate holder, applying electrical potential to the additional electrode assembly, providing feed gas, applying power between the cathode target and the anode to form a plasma, and depositing a layer of target material on the substrate surface.

A method of providing electrically and magnetically enhanced sputtering may include applying power to the substrate holder to generate substrate bias, attracting positive ions from sputtered target material atoms to the substrate, applying heat to the substrate, and flowing feed gas through a gas activation source.

A method of depositing a layer on a substrate includes applying a magnetic field to a cathode target to generate an unbalanced magnetic field and a magnetron configuration on the cathode target; electrically coupling an additional electrode to a ground electrical potential using an electrical circuit comprising an inductor; electrically coupling the additional electrode to a radio frequency (RF) power supply; generating magnetic coupling between the cathode target and the anode; providing a feed gas; and applying power to the cathode target, wherein the RF power supply provides a power selected to increase ionization of sputtered target material atoms associated with the cathode target during sputtering.

The method may include coupling a DC power supply to the cathode, wherein the DC power supply provides output power in a range of 1 to 100 kW. The feed gas may include a noble gas including at least one of argon, xenon, neon, and krypton. The feed gas may include a mixture of a noble gas and a reactive gas. The method may include coupling the RF power supply to the cathode target, wherein the RF power supply provides output power in a range of 1 to 20 kW; and coupling a substrate bias voltage to a substrate holder, wherein the substrate bias voltage comprising a range of −10 V to −200 V. The feed gas may include a mixture of a noble gas and a reactive gas; and a mixture of a noble gas and a gas that comprises atoms of the cathode target material. The method may include coupling a pulsed DC power supply to the cathode target, wherein the pulsed DC power supply provides an output peak power during a pulse in a range of 10 to 1000 kW.

An electrically and magnetically enhanced ionized physical vapor deposition (I-PVD) unbalanced sputtering apparatus that deposits a layer on a substrate includes a vacuum chamber; a cathode target magnet assembly that generates an unbalanced magnetic field and provides a magnetron configuration on a target surface; an additional electrode coupled to a ground electrical potential using an electrical circuit comprising an inductor, wherein the anode is coupled to a radio frequency (RF) power supply; an additional electrode magnet assembly that generates magnetic coupling between a cathode target and the additional electrode; a feed gas; a power supply coupled to the cathode magnet target assembly, wherein the power supply generates a magnetron discharge, and the RF power supply provides a power selected to increase an ionization of atoms associated with the cathode target during sputtering.

The power supply coupled to the cathode target assembly may include a DC power supply providing output power in a range of 1 to 100 kW. The power supply coupled to the cathode target assembly may include a pulsed power supply providing a target power density during a pulse in a range of 0.1 to 5 kW/cm2. A pulsed power supply may generate bipolar asymmetrical voltage oscillations. The amplitude of the negative oscillations can be in the range of 500 V to 3000 V. The amplitude of positive oscillations can be in the range of 50 V to 500 V. The duration of the voltage oscillations can be in the range of 5 μs to 50 μs. The frequency of these oscillations can be in the range of 10 kHz to 200 kHz. The apparatus may include a substrate bias power supply coupled to a substrate holder, wherein the substrate bias power supply provides a bias voltage on a substrate in a range of −10 to −200 V. The feed gas may include a noble gas that includes at least one of argon, xenon, neon, and krypton; and/or a mixture of a noble gas and a reactive gas. Reactive gas can be $N_2$, $O_2$ and $H_2$. The power supply coupled to the cathode magnet target assembly may include a RF power supply providing output power in a range of 1 to 20 kW. The power supply coupled to the cathode magnet target assembly may include a pulsed RF power supply providing output power during the pulse in a range of 5 to 50 kW. The feed gas may include a mixture of a noble gas and gas that comprises atoms of the cathode target. The cathode magnet target assembly may rotate with a speed in a range of 10 to 100 revolutions per minute.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein:

FIG. 5 (*b*) shows a voltage waveform generated by the RF power supply on the anode when the anode is not connected to ground through the inductor;

FIGS. 7 (*b*, *c*) show output voltage waveforms from the high power pulsed power supply shown in FIG. 7(*a*);

FIG. 7 (*d*) shows an illustrative cross-sectional view of the additional electrode and gap electrode assembly;

FIG. 7 (e) shows an illustrative cross-sectional view of the magnetic field lines between magnetron sputtering source and cusp magnetic field near the additional electrode;

FIG. 8 (b) shows an illustrative cross-sectional view of the additional electrode and gap electrode assembly together with the substrate;

FIG. 15 (b) shows an illustrative view of a power pulse that can be generated using a pulse power supply;

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Figure 1:
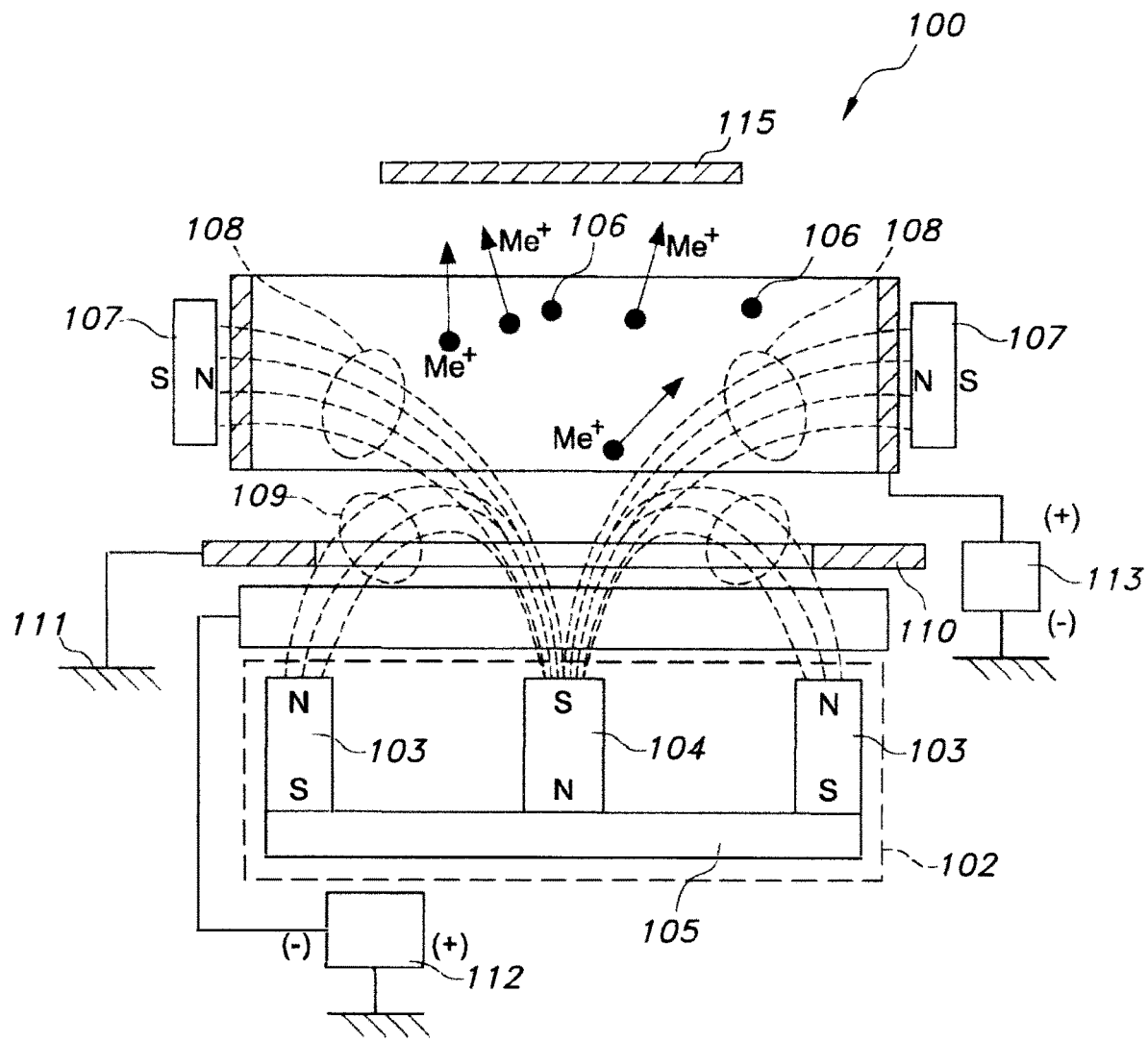
FIG. 1 shows an illustrative cross-sectional view of magnetic field lines of an embodiment of an electrically and magnetically enhanced I-PVD unbalanced magnetron sputtering source with one anode magnet assembly.

FIG. 1 shows a cross-sectional view 100 of magnetic field lines in an embodiment in which an additional electrode 106 has one magnet assembly. A cathode magnet assembly 102 includes magnets 103, 104 and magnetic pole piece 105. The cathode magnet assembly 102 forms a magnetron configuration with magnetic field lines 109 near a target surface 101. A portion of the magnetic field lines 108 cross the additional electrode 106 and terminate on the magnet 107. The additional electrode 106 is connected to a power supply 113. The power supply 113 can generate positive voltage. In an embodiment, the power supply 113 can generate high frequency bipolar asymmetrical voltages. In an embodiment, the power supply 113 can generate a radio frequency (RF) voltage with frequencies in the range of 100 KHz to 100 MHz. In an embodiment, the power supply 113 can generate a negative voltage. When the power supply 112 generates power and a magnetron discharge is formed near the cathode target 101, electrons drift from the target surface 101 towards the additional electrode 106. If power supply 113 provides a positive voltage, electrons are absorbed by the additional electrode 106 and the magnetron discharge has a positive space charge. The positive space charge accelerates a portion of the ionized sputtered target material atoms $Me^+$ away from the target 101 towards a substrate 115. If power supply 113 provides a negative voltage, electrons are trapped between the target 101 and additional electrode 106. Some electrons escape on the anode 110, which has a ground potential. By controlling the value and duration of the negative output voltage from the power supply 113, the electron density can be controlled. By controlling the value and duration of the positive output voltage from the power supply 113, the ion energy and ion density near the substrate 115 can be controlled. In an embodiment, power supply 113 generates RF discharge near the surface of the additional electrode 106. RF discharge increases electron temperature and electron density and, therefore, the degree of ionization of sputtered target material atoms. In an embodiment, power supply 113 generates RF discharge near the surface of the additional electrode 106. Additional electrode 106 is inductively grounded. RF discharge increases electron temperature and electron density and, therefore, the degree of ionization of sputtered target material atoms.

Figure 2:
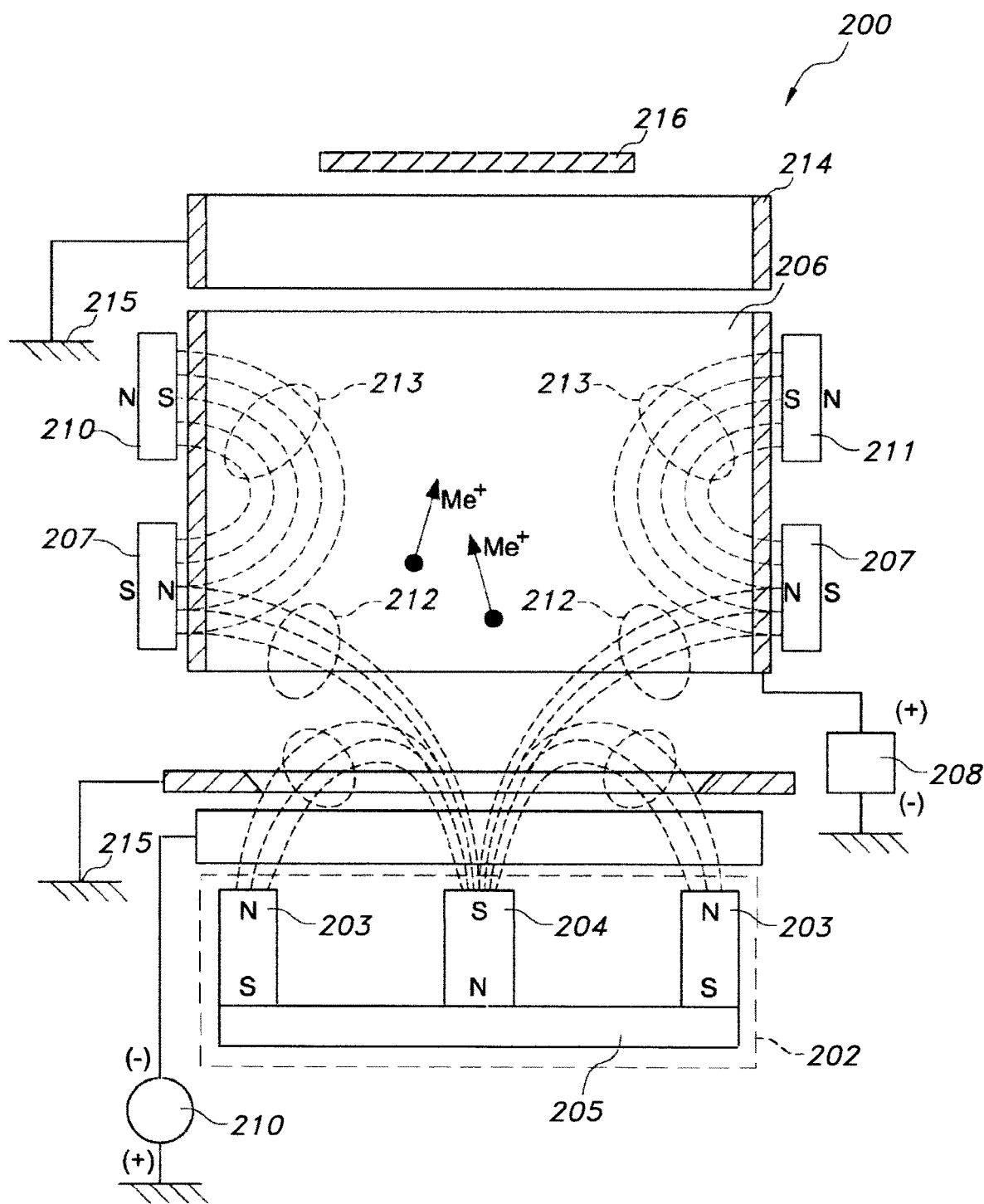
FIG. 2 shows an illustrative cross-sectional view of magnetic field lines of another embodiment of the electrically and magnetically enhanced I-PVD unbalanced magnetron sputtering source with two anode magnet assembles.
Figure 3:
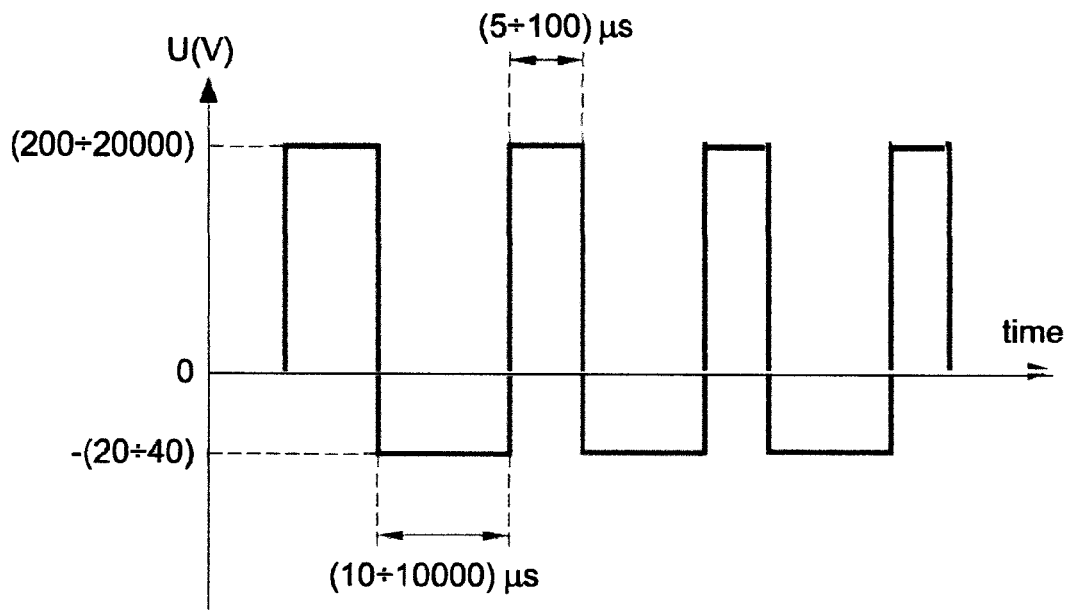
FIG. 3 shows an illustrative view of a bipolar voltage waveform that can be applied to the anode.

FIG. 2 shows a cross-sectional view 200 of magnetic field lines in an embodiment, in which an additional electrode 206 has two magnet assemblies. A cathode magnet assembly 202 includes magnets 203, 204 and magnetic pole piece 205. An anode 216 is positioned adjacent to the cathode target 209 and connected to ground 215. The cathode magnet assembly 202 forms a magnetron configuration with magnetic field lines 209 near the cathode target surface 201. A portion of the magnetic field lines 212 cross the additional electrode 206 and terminate on the magnet 207. The anode 214 is positioned adjacent to the additional electrode 206 and connected to ground 215. The additional electrode 206 is connected to power supply 208. In an embodiment, additional electrode 106 or 206 may have a floating electrical potential. The power supply 208 can generate floating, negative, or high frequency bipolar voltages. When power supply 210 generates power and a magnetron discharge is formed near the cathode target 201, electrons drift from the target surface towards the anode 206. If power supply 208 provides a negative voltage, electrons are trapped between target 201 and anode 206. Some electrons escape on the anode 214, which has a ground potential. By controlling the value and duration of the negative output voltage from the power supply, the electron density can be controlled. The applied negative voltage should not exceed a 40-50 V sputtering threshold in order to prevent sputtering from the additional electrode if the additional electrode is not made from the target material. Preferably, a negative voltage value should be in the range of −10 to −30 V. The electron density controls the degree of ionization of sputtered target material atoms. By controlling the value of the positive output voltage and time duration of the power supply 208, the ion energy and ion density near the substrate can be controlled. A typical rectangular bipolar output voltage provided by power supply 113 or 208 is shown in FIG. 3.

Figure 4:
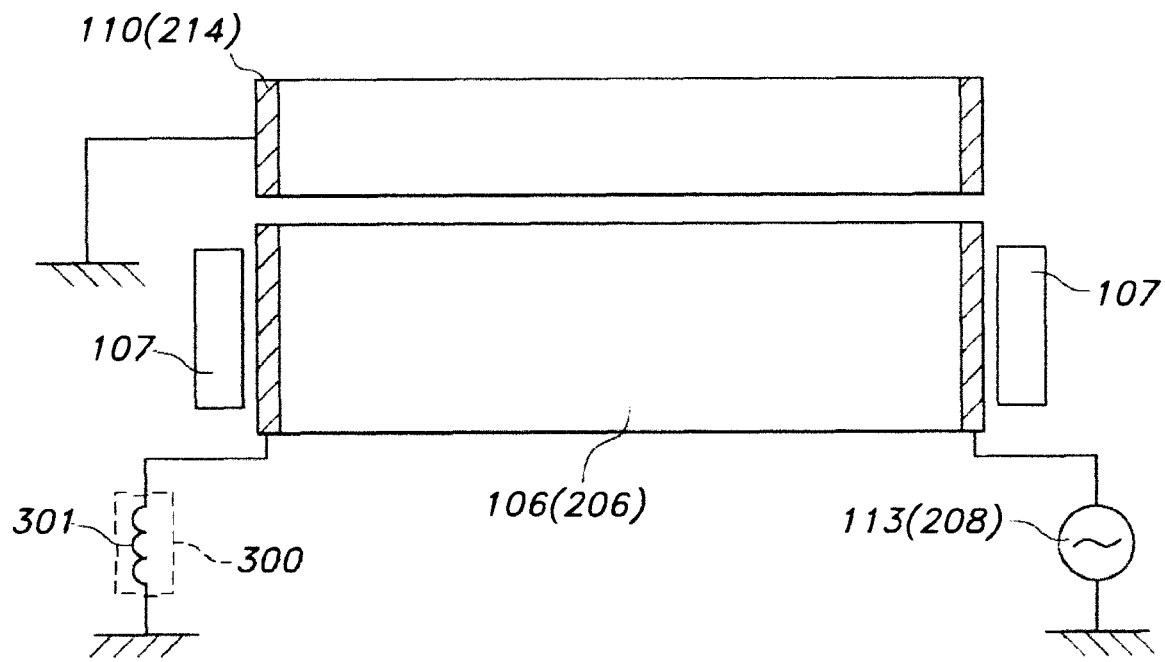
FIG. 4 shows an illustrative cross-sectional view of the anode magnet assembly connected to ground through an inductor and powered with a radio frequency (RF) power supply.
Figure 5A:
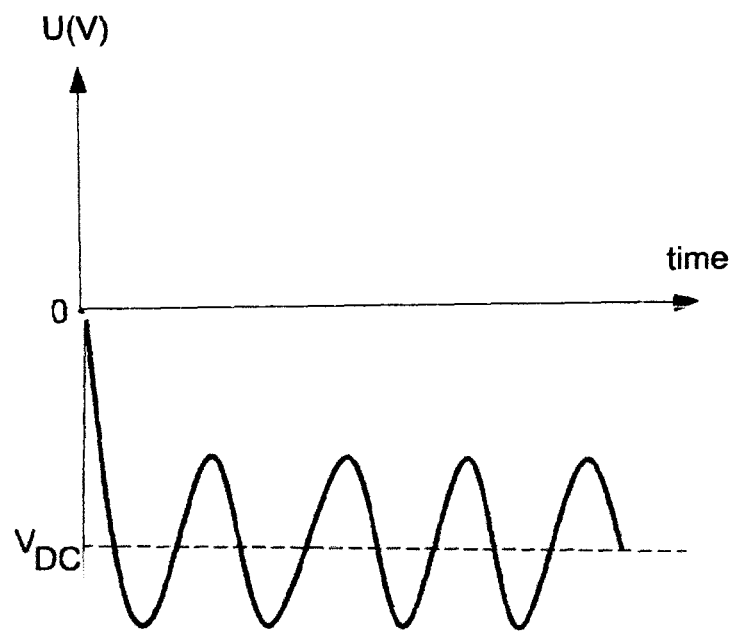
FIG. 5 (*a*) shows a voltage waveform generated by the RF power supply on the anode when the anode is not connected to ground through the inductor.
Figure 5B:
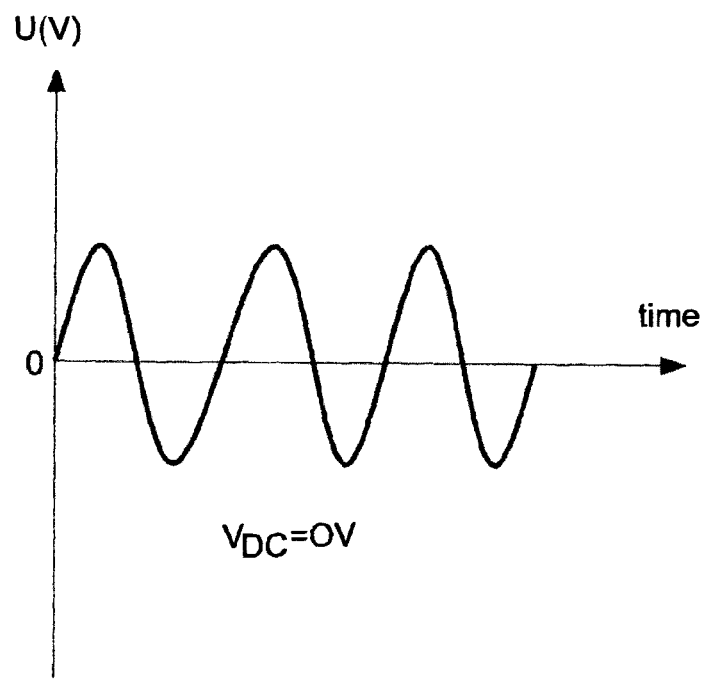

Power supplies 113, 208 can be radio frequency (RF) power supplies that generate output voltages with frequencies in the range of 100 kHz to 100 MHz, as shown in FIG. 4. RF discharge has rectifying properties and generates a negative constant voltage bias $V_{DC}$ on the additional electrode 106, 206 surface as shown in FIG. 5 (a). In order to eliminate this voltage bias and eliminate potential sputtering from the additional electrode, the additional electrode can be connected to ground through an electrical circuit 300 shown in FIG. 4. The electrical circuit 300 has at least one inductor 301 that has a high impedance for RF frequency signals and a substantially zero impedance for the DC current generated by a constant voltage bias. In this case, the additional electrodes 106, 206 are inductively grounded. The RF voltage signal, when additional electrodes 106, 206 are connected to electrical circuit 300, is shown in FIG. 5(b). In this case, if a DC or pulsed DC power supply is connected to the cathode target assembly, the additional electrode 106, 206 is the anode for only a direct current (DC) discharge. If an RF or pulsed RF power supply is connected to the cathode target assembly, additional electrode 106, 206 is an anode. For a high frequency component, the anode 110, 214 is used.

Figure 6:
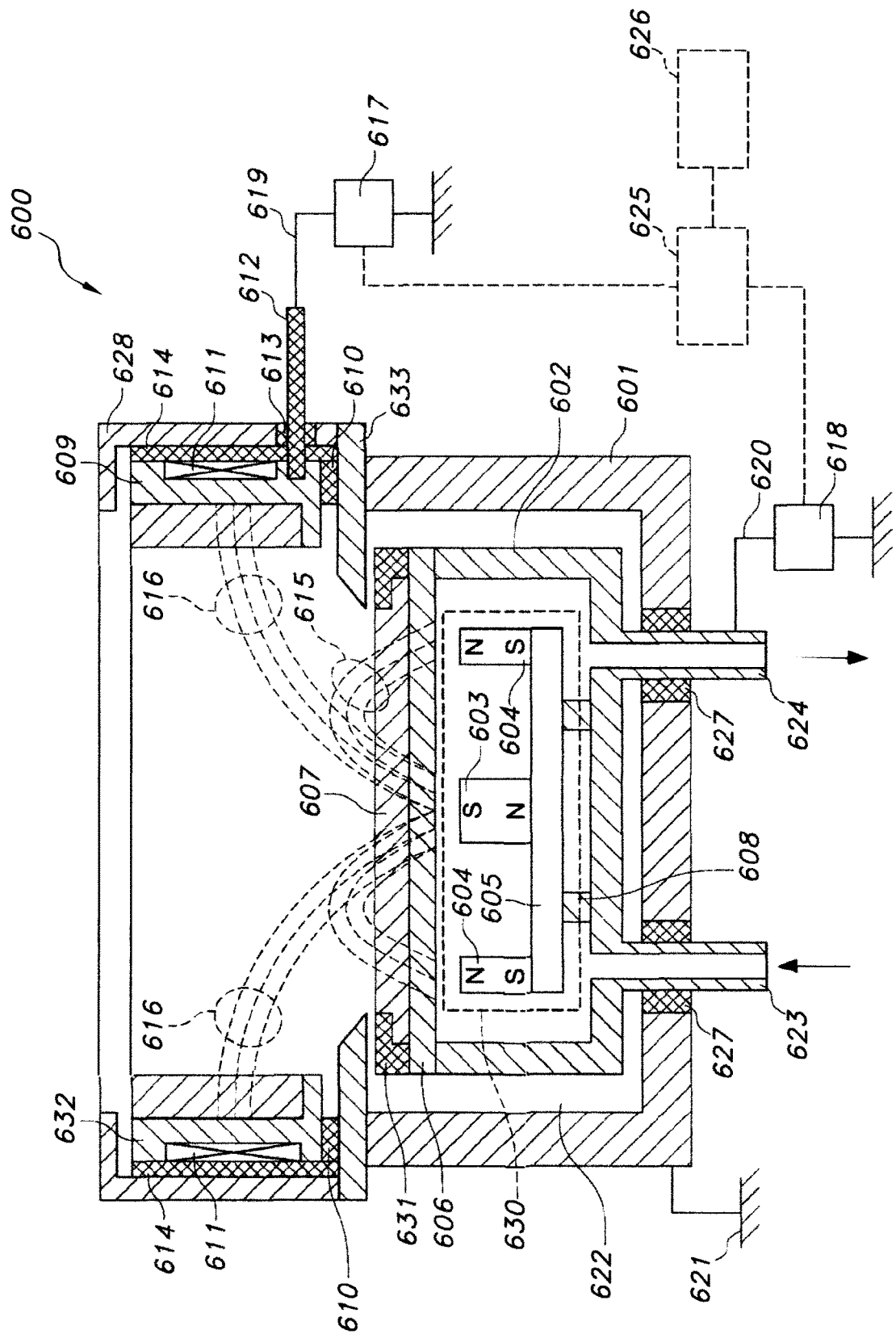
FIG. 6 shows an illustrative cross-sectional view of the electrically and magnetically enhanced I-PVD unbalanced magnetron sputtering source with an anode magnet assembly.
Figure 7A:
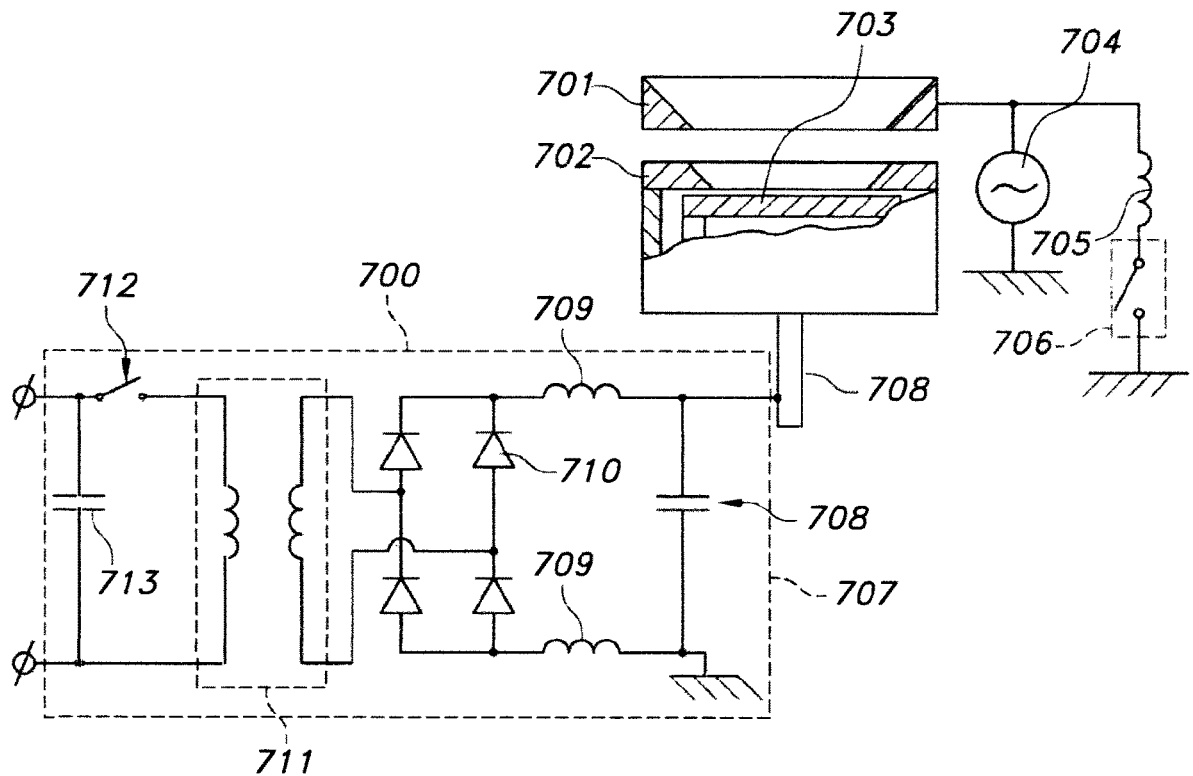
FIG. 7 (*a*) shows an illustrative cross-sectional view of the electrically and magnetically enhanced I-PVD unbalanced magnetron sputtering source including an additional electrode connected with the RF power supply and the cathode target connected to a high power pulsed power supply.
Figure 7B:
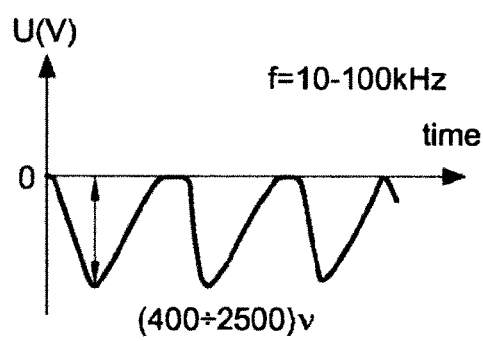
Figure 7C:
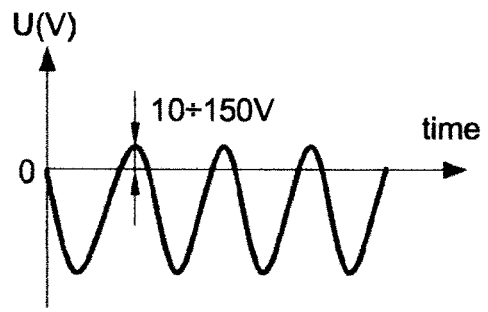
Figure 7D:
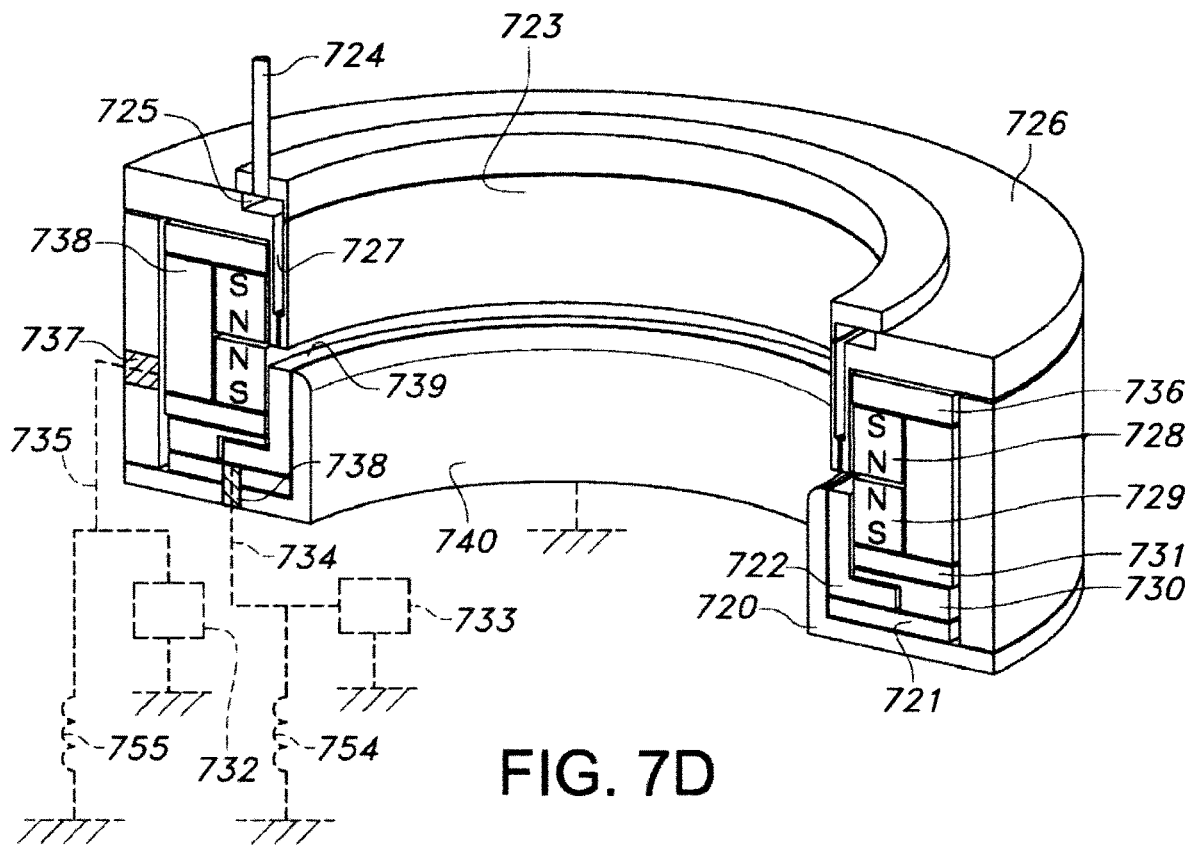
Figure 7E:
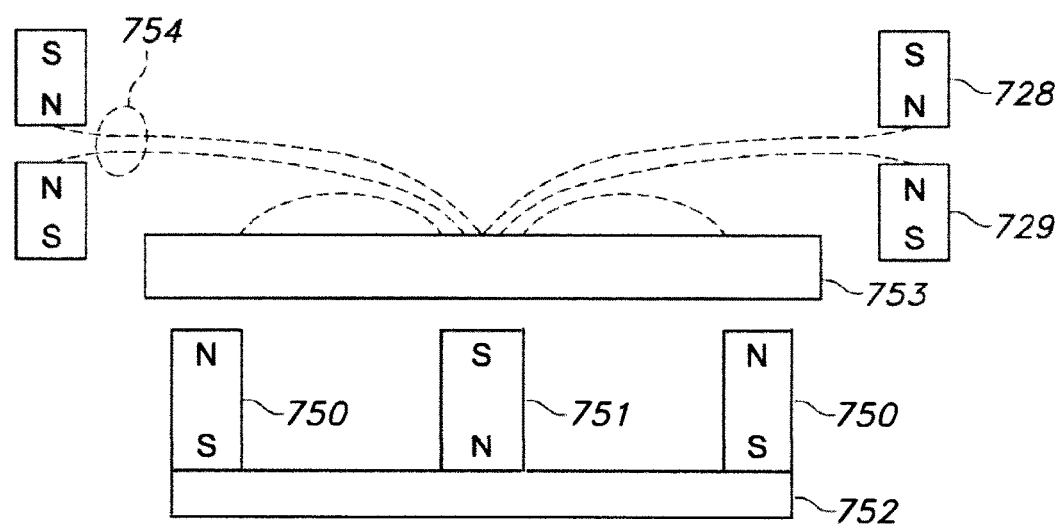

FIG. 6 shows a cross-sectional view of an embodiment of the electrically and magnetically enhanced ionized physical vapor deposition (I-PVD) unbalanced magnetron sputtering source 600. The electrically and magnetically enhanced I-PVD unbalanced magnetron sputtering source 600 includes a housing 601. The housing 601 is electrically connected to ground 621. The cathode assembly includes a water jacket 602 and a cathode target 607. The cathode target 607 can be bonded to the copper backing plate 606 or can be attached to the copper backing plate with a clamp 631. The anode 633 is positioned adjacent to the cathode target 607. The water jacket 602 is electrically isolated from the housing 601 with isolators 627. Water or another fluid for cooling can move inside the water jacket 602 through inlet 623 and can flow outside the water jacket 602 through the outlet 624. There is an air gap 622 between the housing 601 and water jacket 602. The water jacket 602 and, therefore, cathode target 607 are electrically connected to a negative terminal of a power supply 618 through a transmission line 620. The power supply 618 can include a radio frequency (RF) power supply, pulsed RF power supply, high frequency (HF) power supply, pulsed HF power supply, and a matching network. The power supply 618 can include a direct current (DC) power supply, a pulsed DC power supply that generates unipolar negative voltage pulses, a high power pulsed power supply, a pulsed DC power supply that generates asymmetrical bipolar voltage pulses, and a pulsed DC power supply that generates symmetrical bipolar voltage pulses. The power supply 618 can include a pulsed power supply that generates negative triangular voltage pulses. The power supply 618 can be a combination of any power supplies mentioned above. For example, the RF power supply can provide power together with the DC power supply, or the pulsed RF power supply can provide power together with the pulsed DC power supply, or any other pulse power supply. The frequency of the RF power supply and HF power supply can be in the range of 500 kHz-100 MHz. All of the above-mentioned power supplies can operate in current control mode, voltage control mode, and/or power control mode.

The cathode target 607 is formed in the shape of a disk, but can be formed in other shapes, such as a rectangle, and the like. The cathode target 607 material can be conductive, semi-conductive, and/or non-conductive. The following chemical elements, or their combination, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode material. Power supply 618 can be connected to a controller 625 and computer 626. Controller 625 and/or computer 626 control the output power values and timing of the power supplies 618 and 617. Power supply 618 can operate as a standalone unit without connecting to controller and/or computer.

The cathode assembly includes a cathode magnetic assembly 630 positioned inside the water jacket 602. The cathode magnetic assembly 630 in an embodiment includes magnets 604, 603, and a disc-shaped magnetic pole piece 605 made from magnetic material, such as iron. Magnets 604, 603 form a magnetron configuration on the surface of the cathode target 607. The magnetron configuration has magnetic field lines 615.

A ring-shaped additional electrode 609 is positioned around the cathode target 607 on the supporter 632. An additional electrode magnet assembly has a cylindrical shape and is positioned behind the ring-shaped additional electrode 609 in the supporter 632. The anode magnet assembly includes a plurality of permanent magnets 611. In an embodiment, rather than using permanent magnets, electromagnets can be used. The value of the magnetic field caused by the permanent magnets 611 is in a range of 100 to 1000 G. The magnets 611 provide magnetic coupling with magnet 603 and, therefore, with a surface of the target 607 through magnetic field lines 616. In an embodiment, the magnet 611 provides magnetic coupling with magnets 604.

The additional electrode 609 is electrically isolated from a ground shield 628 by isolators 614, 610, 613. The additional electrode 609 is connected to power supply 617 through transmission line 619, and electrode 612. Power supply 617 can be connected to controller 625.

The magnetic fields 616 shown in FIG. 6 are shaped to provide electron movement between the cathode target 607 and additional electrode 609. During this movement, electrons ionize and/or dissociate feed gas molecules and/or sputtered target material atoms.

FIG. 7 (a) shows the additional electrode 701 connected to RF power supply 704 and inductively grounded through inductor 705 and switch 706. The cathode target 703 is connected to a high power pulsed power supply that generates oscillatory voltage with frequency in a range of 10 to 100 KHz. The block diagram of the high power supply shows capacitor bank 713 and solid state switch 712, which can release energy from the capacitor 713 to transformer 711. Transformer 711, diodes 710, inductors 709, and capacitor 708 form oscillatory voltage waveforms, as shown in FIGS. 7 (b) and 7 (c).

In an embodiment, the additional electrode 738 is positioned behind the gap 739 as shown in FIG. 7 (d). The additional electrode 738 has two rows of permanent magnets that form a cusp magnetic field in the gap 739. Two pole pieces 736, 731 are positioned on top and bottom of the magnets 728, 729. Additional electrode 738 has anode 723. The anode 723 has feed gas chamber 725 and feed gas inlet 724. The feed enters through a plurality of cylindrical holes 727. The additional electrode can be connected to power supply 732 through transmission line 735. The power supply 732 can be an RF power supply that generates output voltage with frequencies in the range of 100 KHz and 100 MHz. The power supply 732 can be a pulsed power supply or DC (direct current) power supply. The additional electrode 738 can be grounded through inductor 755. The gap 739 is formed between the anode 723 and gap electrode 722. The gap electrode 722 is positioned behind the grounded shield 720. The additional electrode 738 is positioned on the isolator 730. The gap electrode 722 is positioned on isolator 721. The gap electrode is connected to the power supply 733. The power supply 733 can be an RF power supply that generates output voltage with frequencies in the range of 100 KHz to 100 MHz. The power supply 733 can be a pulsed power supply or DC power supply. The gap electrode can be grounded through inductor 754. The electric field in the gap 739 is substantially perpendicular to magnetic field lines. The magnetic field lines are shown in FIG. 7 (*e*). In an embodiment, the gap electrode 722 has a ground potential and power supply 732 releases voltage on additional electrode 738. In an embodiment, additional electrode 738 has a ground potential or floating potential, and power supply 733 releases voltage on gap electrode 722.

Magnetic field lines are shown in FIG. 7 (*e*). Magnets 750, 751 and magnetic pole piece 752 form a magnetron configuration on the cathode target 753. Magnets 728 and 729 form a cusp magnetic field 754.

Figure 8A:
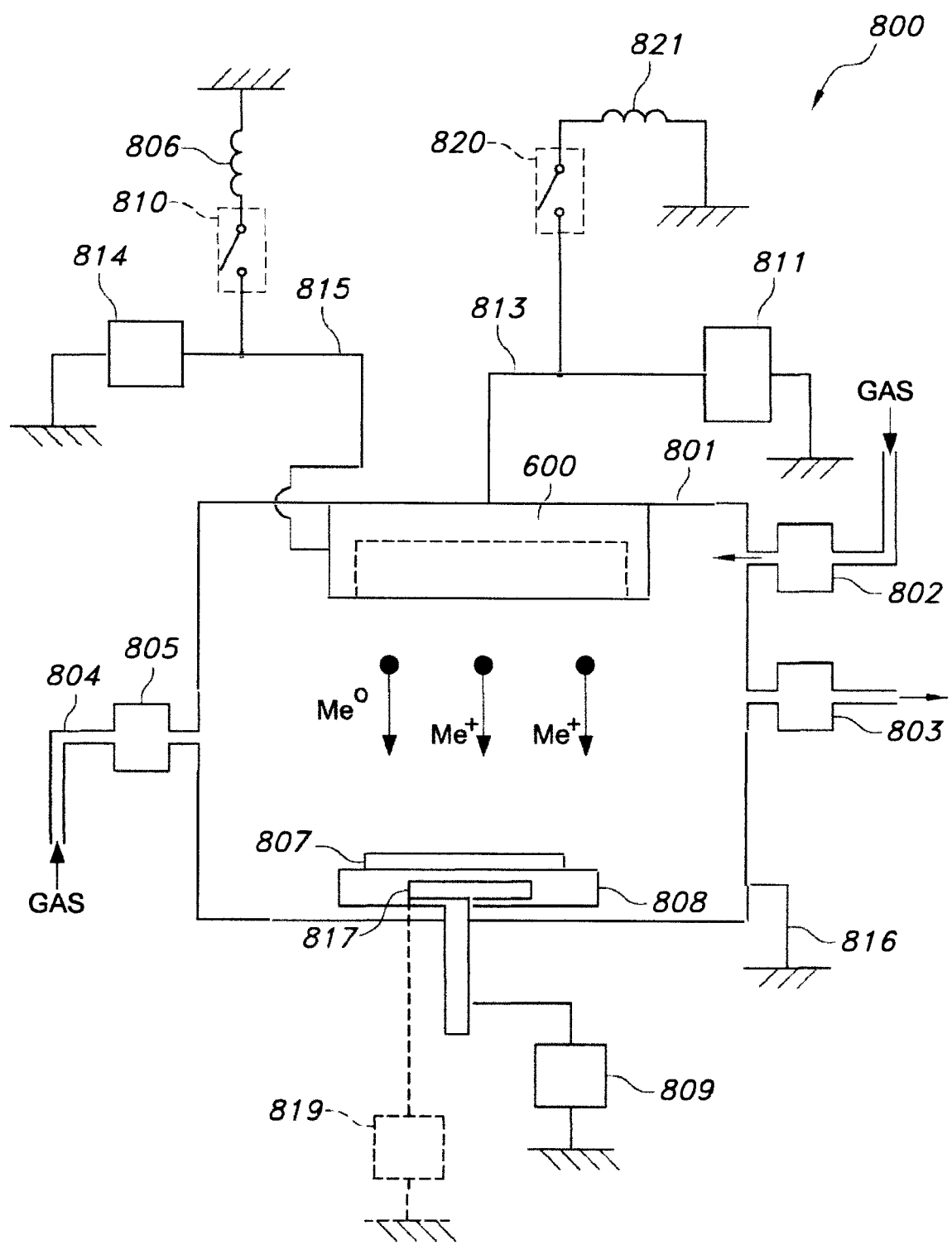
FIG. 8 (a) shows an illustrative cross-sectional view of an electrically and magnetically enhanced I-PVD unbalanced magnetron sputtering system.
Figure 8B:
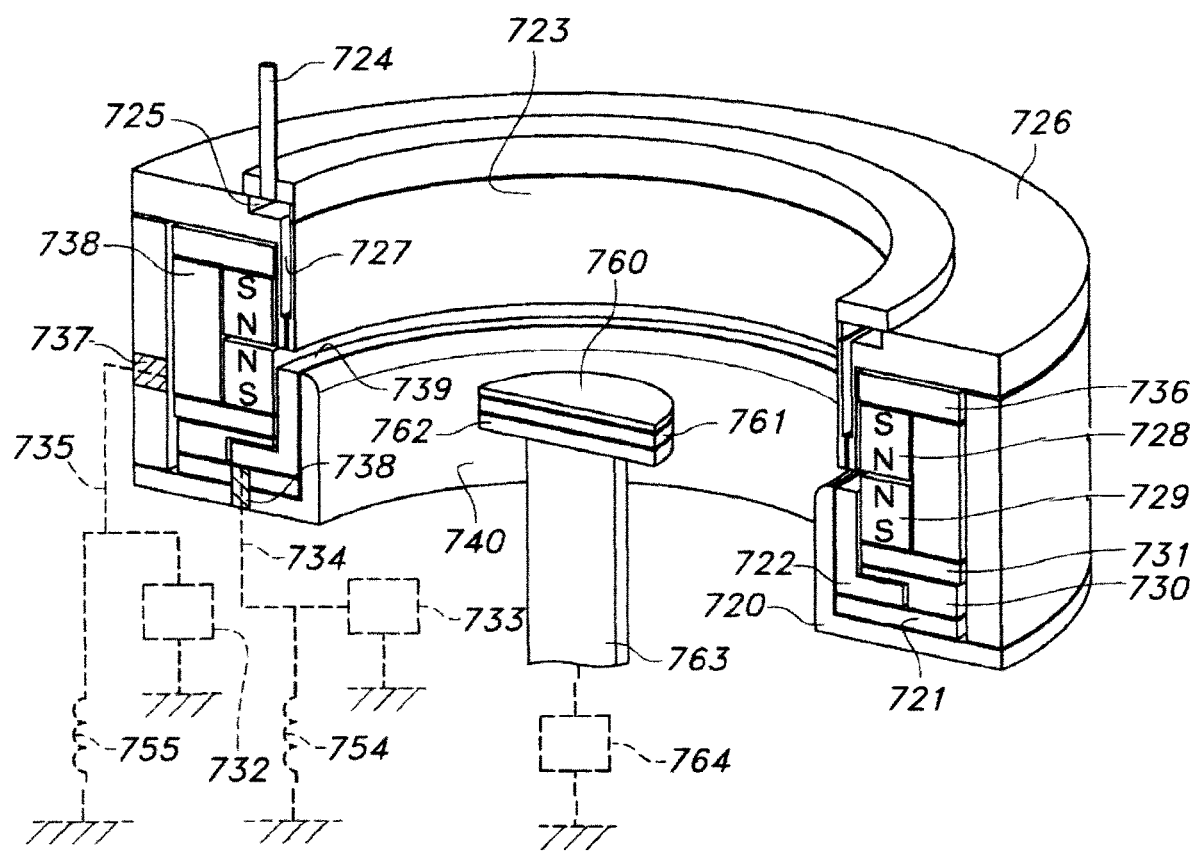

The electrically and magnetically enhanced I-PVD unbalanced magnetron sputtering source 600 can be mounted inside a vacuum chamber 801 as shown in FIG. 8 in order to construct the electrically and magnetically enhanced I-PVD unbalanced magnetron sputtering apparatus 800. The vacuum chamber 801 contains feed gas and plasma. The vacuum chamber 801 is coupled to ground 816. The vacuum chamber 801 is positioned in fluid communication with a vacuum pump 803, which can evacuate the feed gas from the vacuum chamber 801. Typical baseline pressure in the vacuum chamber 801 is in a range of $10^{-6}$-$10^{-9}$ Torr.

A feed gas is introduced into the vacuum chamber 801 through a gas inlet 804 from a feed gas source. In an embodiment, a feed gas is introduced into the vacuum chamber 801 through a gas activation source 802. A mass flow controller 805 controls gas flow to the vacuum chamber 801. In an embodiment, the vacuum chamber 801 has a plurality of gas inlets and mass flow controllers. The gas flow can be in a range of 1 to 1000 SCCM depending on plasma operating conditions, pumping speed of the vacuum pump 803, process conditions, and the like. Typical gas pressure in the vacuum chamber 801 during a sputtering process can be in a range of 0.1 mTorr to 100 mTorr. In an embodiment, a plurality of gas inlets and a plurality of mass flow controllers sustain a desired gas pressure during the sputtering process. The plurality of gas inlets and plurality of mass flow controllers may be positioned in the vacuum chamber 801 at different locations. The feed gas can be a noble gas, such as Ar, Ne, Kr, Xe; a reactive gas, such as $N_2$, $O_2$; or any other gas that are suitable for sputtering or reactive sputtering processes. The feed gas can also be a mixture of noble and reactive gases. The feed gas can be a gas that contains the same atoms as a target material.

In an embodiment, the target material is carbon. The feed gases are $C_2H_2$ or any other gas that contains carbon atoms and a noble gas such as argon.

FIG. 8 shows an embodiment of an electrically and magnetically enhanced magnetron sputtering apparatus 800, which includes a substrate support 808 that holds a substrate 807 or other work piece for plasma processing. The substrate support 808 is electrically connected to the bias voltage power supplies 809. The bias voltage power supplies 809 can include a radio frequency (RF) power supply, alternating current (AC) power supply, and very high frequency (VHF) power supply, and/or direct current (DC) power supply, high power pulse power supply. The bias power supply 809 can operate in continuous mode or pulse mode. The bias power supply 809 can be combination of different power supplies that can provide different frequencies. The negative bias voltage on the substrate can be in a range of 0 and −2000 V. The negative substrate bias voltage can attract positive ions to the substrate. At bias voltages in the range of −800 V and −1000 V the ions from sputtered target material atoms can etch substrate surface. At higher bias voltage sputtered target material ions can be implanted to substrate surface. The substrate support 808 can include a heater 817 that is connected to a temperature controller 818 (exact connection is not shown). The temperature controller 818 regulates the temperature of the substrate 807. In an embodiment, the temperature controller 710 controls the temperature of the substrate 807 to be in a range of −20 C-(+400) C.

The cathode target from the electrically and magnetically enhanced magnetron sputtering source is connected to power supply 811 through transmission line 813. The additional electrode from the electrically enhanced sputtering source is connected to power supply 814 through the transmission line 815. If power supply 814 is an RF power supply, the additional electrode can be inductively grounded through inductor 806 and switch 810. In an embodiment, there is no switch 810. If power supply 811 is an RF power supply, the additional cathode target assembly can be inductively grounded through inductor 821 and switch 820. In an embodiment, there is no switch 820.

During sputtering, a noble gas, such as argon, is flowing in the chamber 801 through inlet 804 or gas activation source 802. The gas pressure can be in the range of 0.5-50 mTorr. The substrate bias can be between −10 V and −200 V. In an embodiment, power supply 811 generates pulsed power with triangular or rectangular voltage pulse shapes or any other voltage pulse shapes. The pulsed power supply can generate asymmetrical bipolar pulses. At the same time, power supply 814 generates pulsed or continuous RF discharge near the additional electrode. This RF discharge increases the electron energy and electron density, thereby increasing the ionization rate of the sputtered target material atoms. That is, the pulsed power supply connected to the cathode target controls the deposition rate, and the RF power supply that is connected to the additional electrode controls plasma density and electron energy. The RF power can be in the range of 1-20 kW. In an embodiment, power supply 811 generates DC power. The DC power can be in the range of 1-100 kW depending on the area of the cathode target.

In an embodiment, a cathode target magnet assembly includes multiple small magnetrons. In an embodiment, one part of the cathode target magnet assembly forms a magnetron configuration and another part forms a non-magnetron configuration.

The electrically and magnetically enhanced ionized physical vapor deposition (I-PVD) unbalanced magnetron sputtering apparatus can be configured for chemically enhanced I-PVD, plasma enhanced CVD, reactive ion etch (RIE), or sputter etch applications. Typically, for CVD, RIE, and sputter etch applications, the cathode target assembly and additional electrodes are connected to the RF power supplies and are inductively grounded. The RF frequency on the additional electrode and cathode target assembly can be different. In an embodiment, the RF frequency on the additional electrode is 27 MHz, and the RF frequency on the cathode target assembly is 13.56 MHz. The RF power supplies 814, 811 can be pulsed RF power supplies and can be synchronized. The cathode target magnet assembly for CVD, RIE, and sputter etch applications can have magnet assemblies that generate magnetic field lines, which are substantially perpendicular to the cathode surface.

In some embodiments, the assembly of the additional electrode and the gap electrode that is shown in FIG. 7 (*d*) can be used separately from the magnetron sputtering source as shown in FIG. 8 (*b*). A substrate 760 is positioned on the magnetic pole piece 761 and heater 762. Supporter 763 is connected to substrate bias power supply 764. This configuration can be used for CVD and RIE applications. The cusp magnetic field formed by magnets 728 and 729 provides a magnetic field with pole piece 761. For CVD or RIE applications, electrode 722 can be inductively grounded through inductor 754 in order to control negative RF bias voltage. In an embodiment, electrode 722 is inductively grounded through a resistor and inductor. In an embodiment, this configuration is used to grow diamond films.

Figure 9:
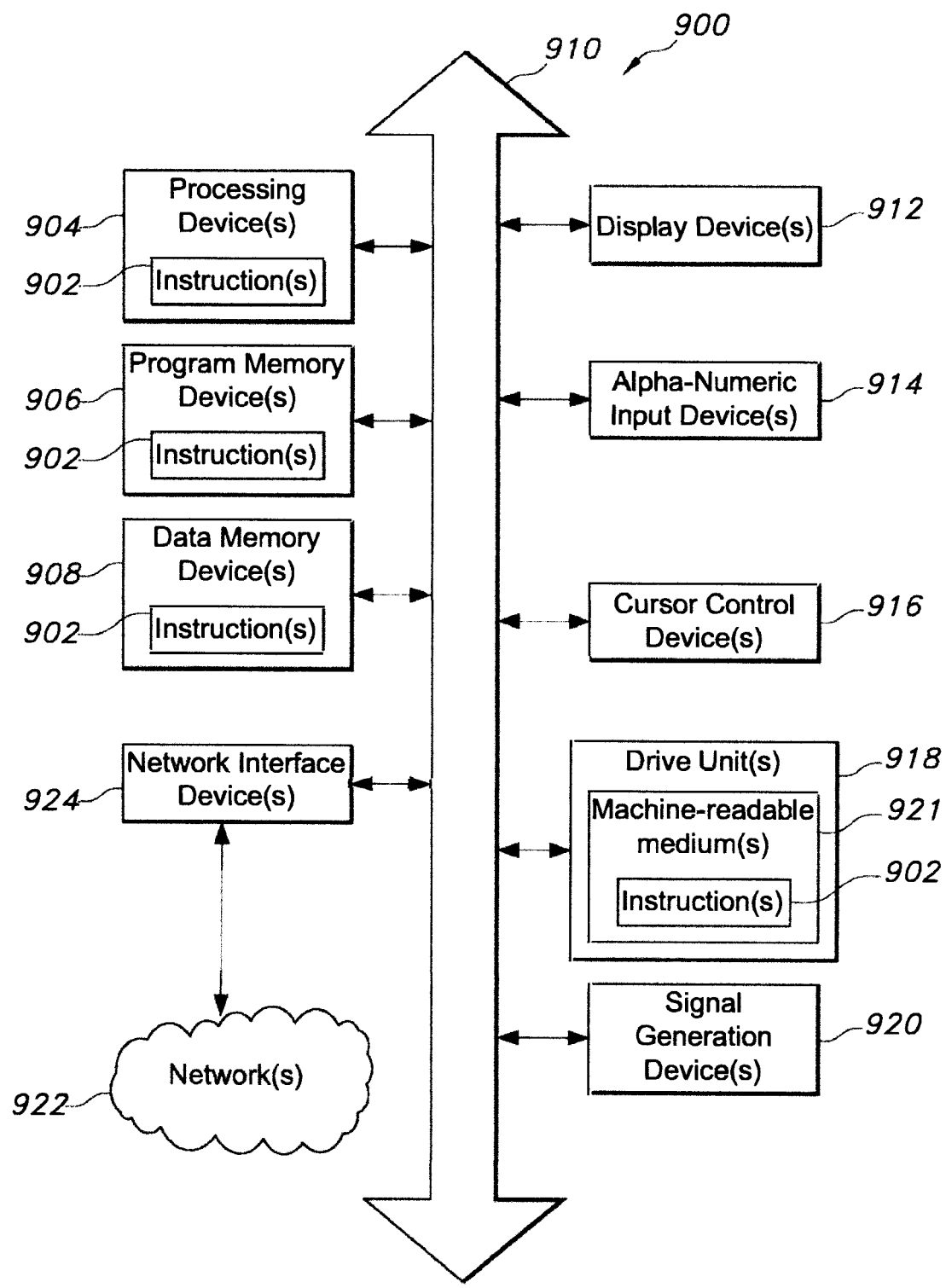
FIG. 9 shows a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 9 is a block diagram of an embodiment of a machine in the form of a computing system 900, within which is a set of instructions 902 that, when executed, cause the machine to perform any one or more of the methodologies according to disclosed embodiments. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by disclosed embodiments include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of disclosed embodiments.

An integrated circuit in accordance with the disclosed embodiments can be employed in essentially any application and/or electronic system in which buffers are utilized. Suitable systems for implementing one or more embodiments include, but are not limited to, personal computers, interface devices (e.g., interface networks, high-speed memory interfaces (e.g., DDR3, DDR4, etc.), data storage systems (e.g., RAID system), data servers, etc. Systems incorporating such integrated circuits are considered part of the disclosed embodiments. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

Figure 10:
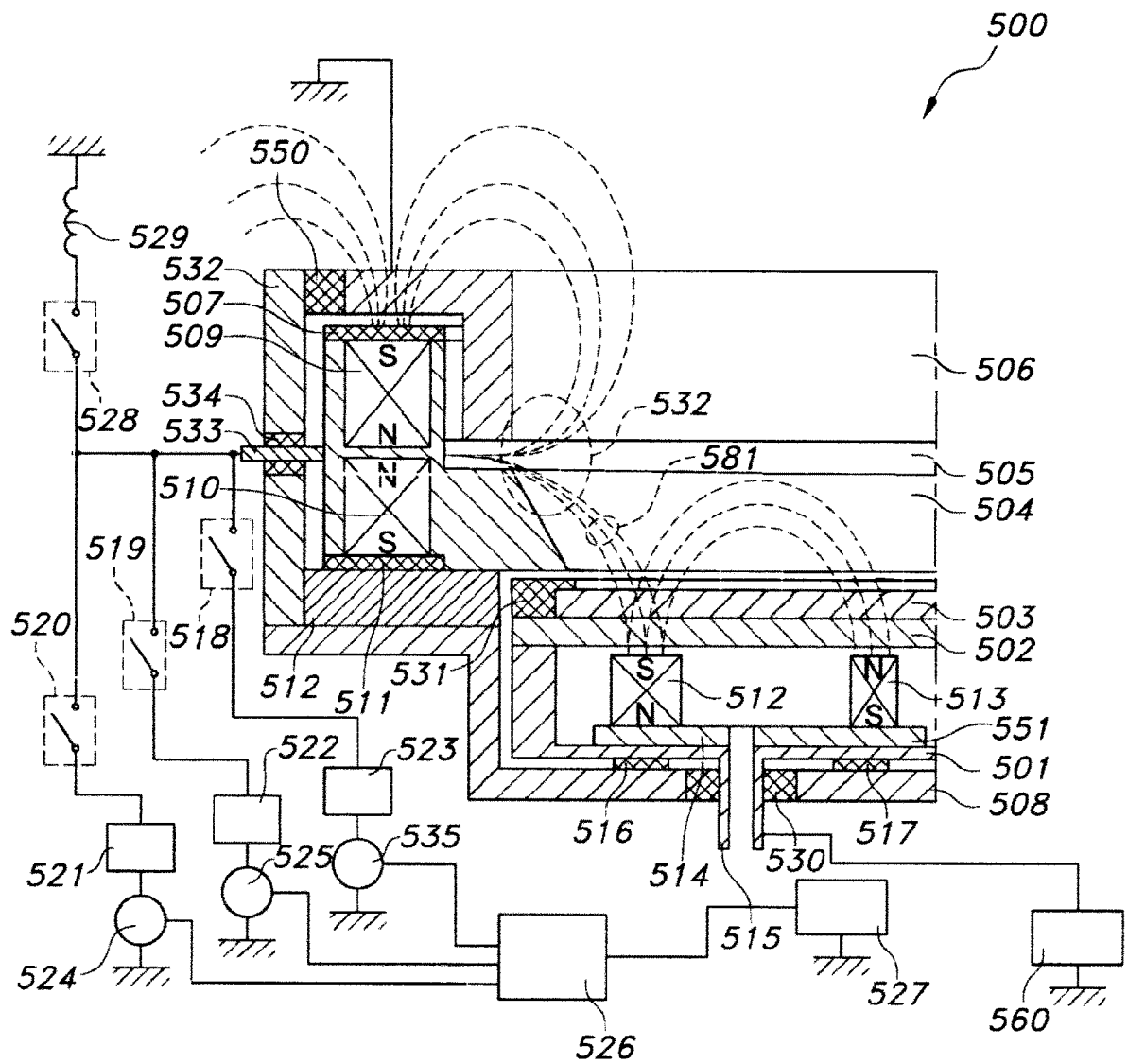
FIG. 10 shows an illustrative cross-sectional view of an embodiment of an electrically and magnetically enhanced I-PVD unbalanced magnetron sputtering source, in which a cathode magnet assembly is unbalanced from the edge.

FIG. 10 shows another embodiment 500 of the electrically and magnetically enhanced I-PVD unbalanced magnetron sputtering source. The apparatus 500 includes a cathode target 503 that is positioned on a top cover 502 of a water jacket 501. A clamp 531 holds the cathode target 503 on the top cover 502. Inside the water jacket 501, there is a magnet assembly. The cathode target magnet assembly includes magnets 512, 513 and magnetic pole piece 551. The cathode target magnet assembly forms a magnetron configuration on the cathode target 503. The water jacket 501 has a water inlet 515 and a water outlet (not shown). Water jacket 501 is positioned inside a housing 508. The water jacket 501 is isolated from the housing 508 with isolators 516, 517, 530.

An electrode 504 is positioned adjacent to the cathode target 503. The electrode 504 and anode 506 form a gap 505. The anode 506 is separated from cylindrical shield 532 with isolator 550. Magnets 509 and 510 form a cusp magnetic field 532 in the gap 505. The electrode 504 is seated on top of the isolator 590. The top cover 502 and bottom cover 511 hold the magnets in one assembly. The magnets 509, 510 face in the same polarity direction, north-north or south-south. The magnets 509 and 510 are positioned inside the electrode 504. The covers 507 and 511 hold magnets 510 and 509 together. The electrode 504 is connected to connector 533. Connector 533 is isolated from side cover 532 with isolator 534. Switches 528, 520, 519, 518 can be connected to controller 526 and computer 527 (not shown).

Electrode 504 can be connected to power supplies 524, 525, 535 and matching networks 521, 522, 523 through switches 520, 519, 518, respectively. The power supplies can be connected to controller 526 and computer 527. The electrode 504 can be grounded through switch 528 and inductor 529. Power supplies 524, 525, 535 can be radio frequency (RF) or very high frequency (VHF) power supplies. For example power supply 524 can be a power supply that generates continuous voltage with a frequency of 13.56 MHz or pulse voltage with a frequency of 13.56 MHz. Power supply 525 can be a power supply that generates continuous voltage with a frequency of 27 MHz or pulse voltage with a frequency of 27 MHz. Power supply 535 can be a power supply that generates voltage with a frequency of 60 MHz. The power of these power supplies can be in a range of 1-10 KW. The electrode 504 can be water cooled (not shown). In an embodiment, electrode 504 is made from the same material as cathode target 503. In an embodiment, the inductor 529 is connected with ground through a resistor. In an embodiment, when switch 528 is closed, the negative voltage bias generated by RF power supply 524 is less than 50 V. In an embodiment, the electrode 504 can be connected to a pulse power supply that generates negative voltage pulses or asymmetrical bipolar voltage pulses as shown in FIGS. 7 (b) and 7(c).

In an embodiment, electrode 504 can be made from dielectric material. The power supply 560 can be connected to the cathode 503 through water inlet 515, and can be a variable DC power supply, RF power supply, VHF power supply, and/or pulsed power supply that generates unipolar negative voltage pulses or bipolar voltage pulses. Bipolar voltage pulses can be symmetrical or asymmetrical. These power supplies can operate in voltage mode, current mode, power mode, or mixed mode. The pulsed power supply can generate asymmetrical bipolar voltage pulses or negative voltage pulses as shown in FIGS. 7 (b) and 7(c). The magnetic field lines 581 provides magnetic coupling between the electrode 504 and cathode 503. The electrons generated by discharge between electrode 504 and anode 506 drift towards cathode 503 and increase plasma density for the discharge between the cathode 503 and anode 506. The degree of ionization of the sputtered cathode target 503 material atoms will increase.

Figure 11:
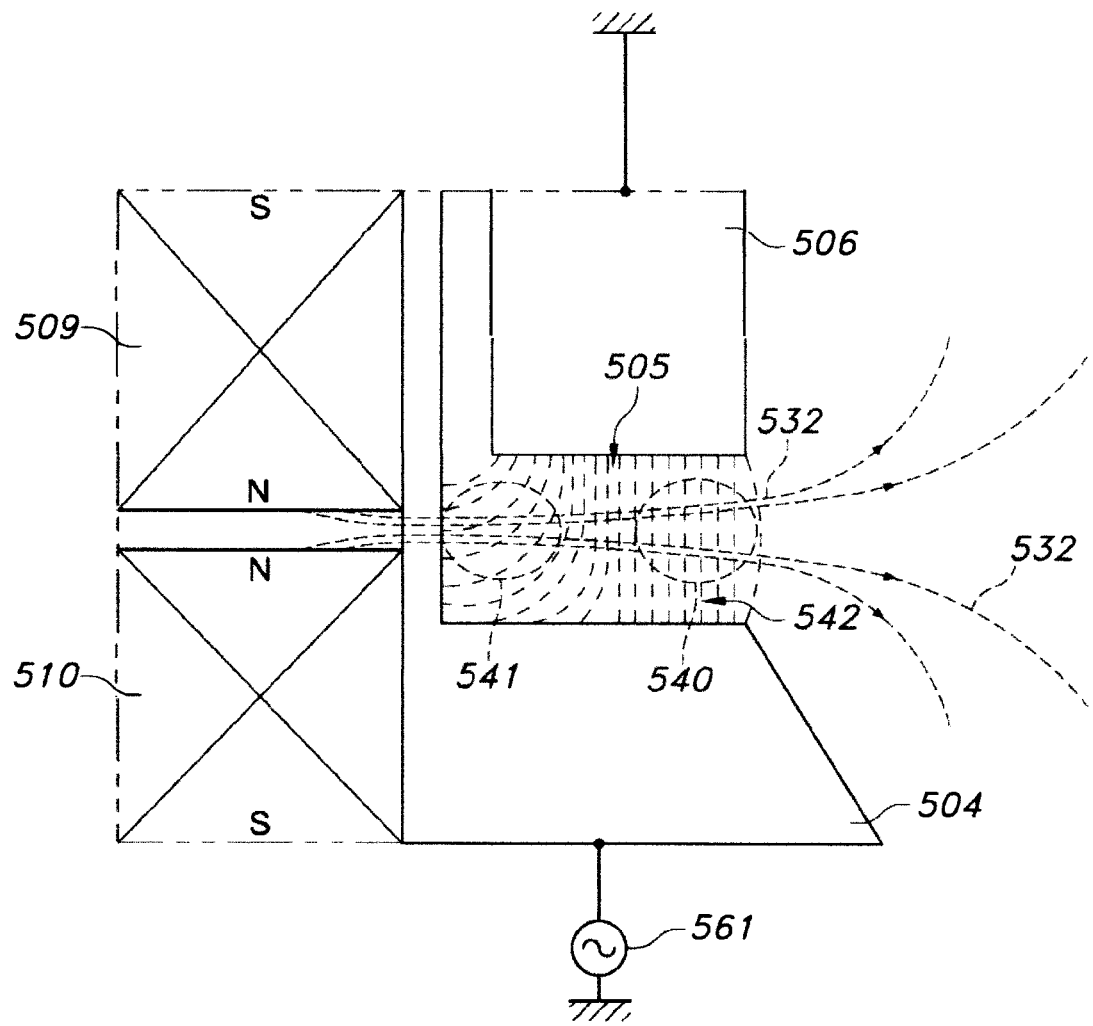
FIG. 11 shows an illustrative cross-sectional view of magnetic field lines in the gap for the electrically and magnetically enhanced I-PVD unbalanced magnetron sputtering source shown in FIG. 10.

FIG. 11 shows magnetic 532 and electric 542 field lines in the gap 505. In the area 541, the magnetic field lines 532 are substantially parallel to the electric field lines 542. In the area 540, the electric field lines 542 are substantially perpendicular to the magnetic field lines 532. Therefore, in this embodiment of gap design, it is possible to simultaneously have a discharge with electric field lines that are parallel and perpendicular to the cusp magnetic field in the gap. Power supply 561 can be an RF power supply, pulse power supply that generates negative voltage pulses, asymmetrical bipolar pulses, or variable DC power supply.

Figure 12:
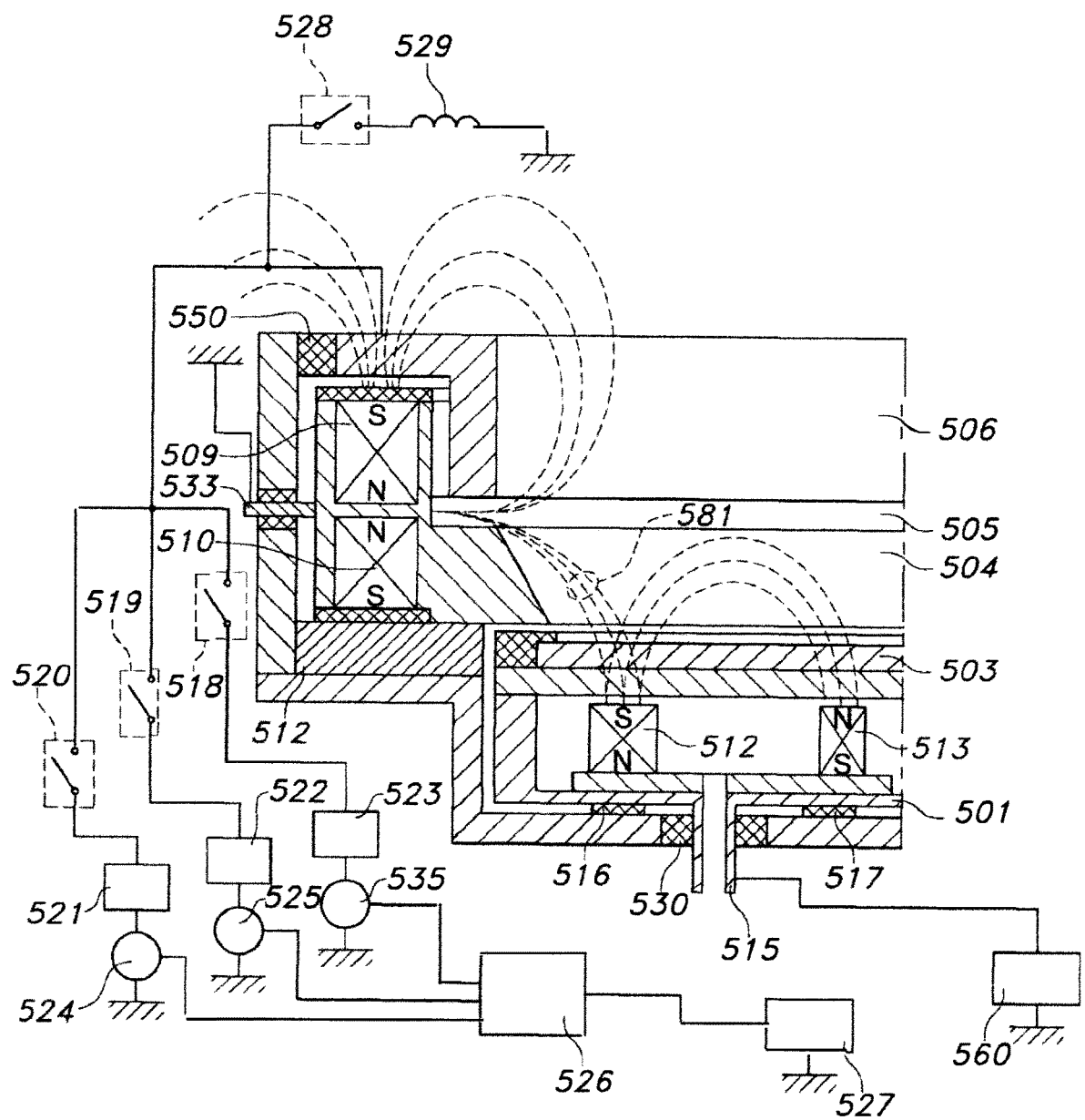
FIG. 12 shows an illustrative cross-sectional view of an embodiment of an electrically and magnetically enhanced I-PVD unbalanced magnetron sputtering source, in which the cathode magnet assembly is unbalanced from the edge.

FIG. 12 shows an embodiment in which power supplies 524, 525, 535 are connected to the anode 506, and the electrode 504 is grounded. Anode 506 can be grounded through switch 528 and inductor 529. In an embodiment, anode 506 is grounded through inductor 529 and resistor. In an embodiment, the negative RF bias on the inductively grounded anode 506 is less than 50 V. In this case, anode 506 becomes an electrode and electrode 504 becomes an anode. The switches 520, 519, 518, 528 can be connected to controller 526 and computer 527. In an embodiment the cathode target 503 magnet assembly can be rotatable.

Figure 13:
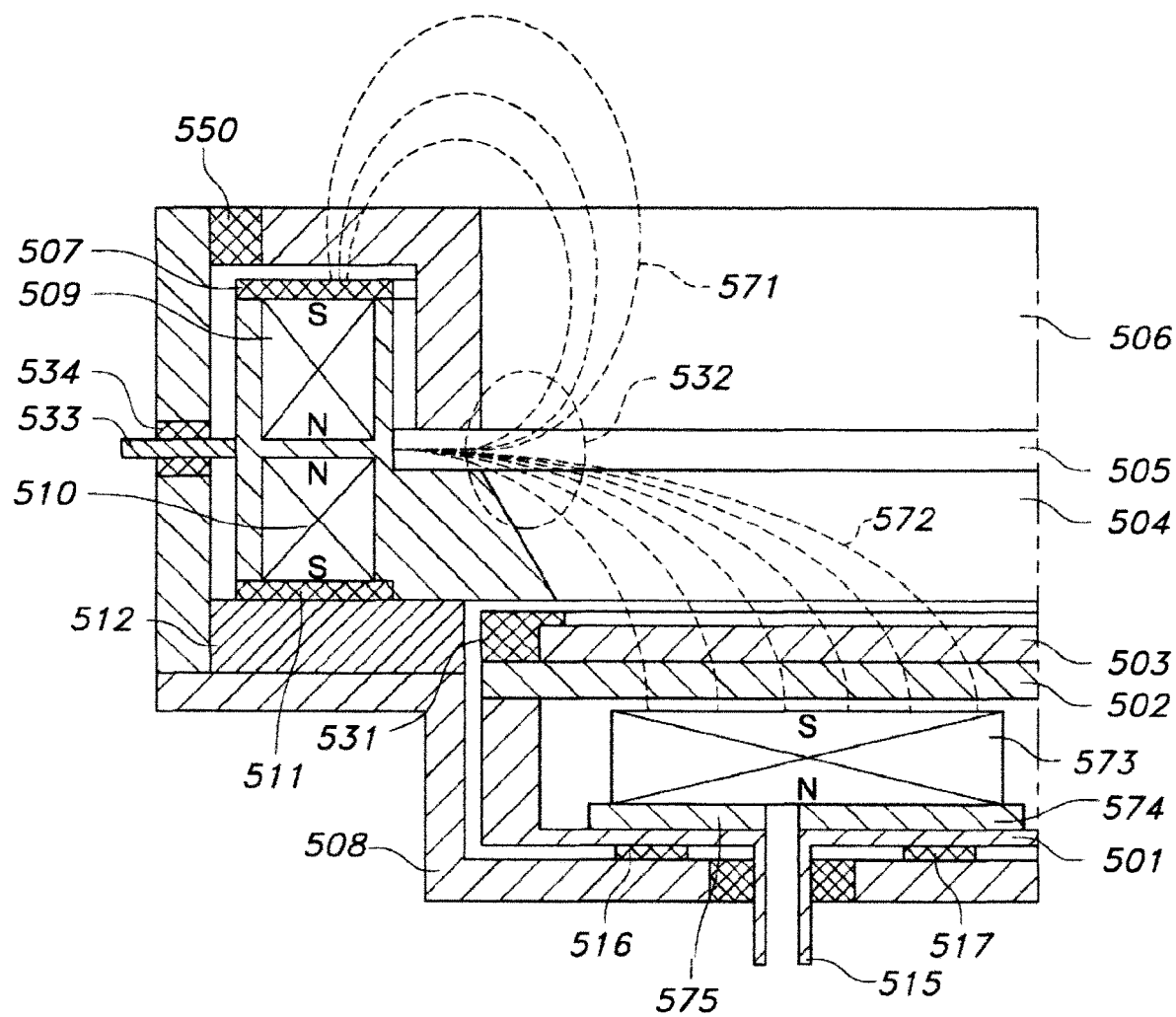
FIG. 13 shows an illustrative cross-sectional view of an embodiment of an electrically and magnetically enhanced I-PVD unbalanced magnetron sputtering source, in which the cathode magnet assembly forms magnetic field lines that are substantially perpendicular to the cathode surface.

FIG. 13 shows an embodiment in which the cathode 503 magnet assembly does not form a magnetron configuration. Magnet 573 and magnets 509, 510 form magnetic field lines substantially perpendicular to the cathode surface. Portion of the cusp magnetic field lines 571 terminates on south pole of the magnet 509. Portion of cusp magnetic field lines 572 terminates on the south pole of the magnet 573. The magnet 573 is positioned on supporters 575 and 574. This configuration can be used for CVD, RIE, sputter etch, and sputtering applications. Cathode 503 can be powered with different power supplies through water inlet 515. Cathode 503 can be inductively grounded. In this configuration, electrode 504 can be powered or grounded, and anode 506 can be powered or grounded, as shown in FIGS. 10 and 12. In an embodiment, the feed gas can flow through the gap 505.

Figure 14:
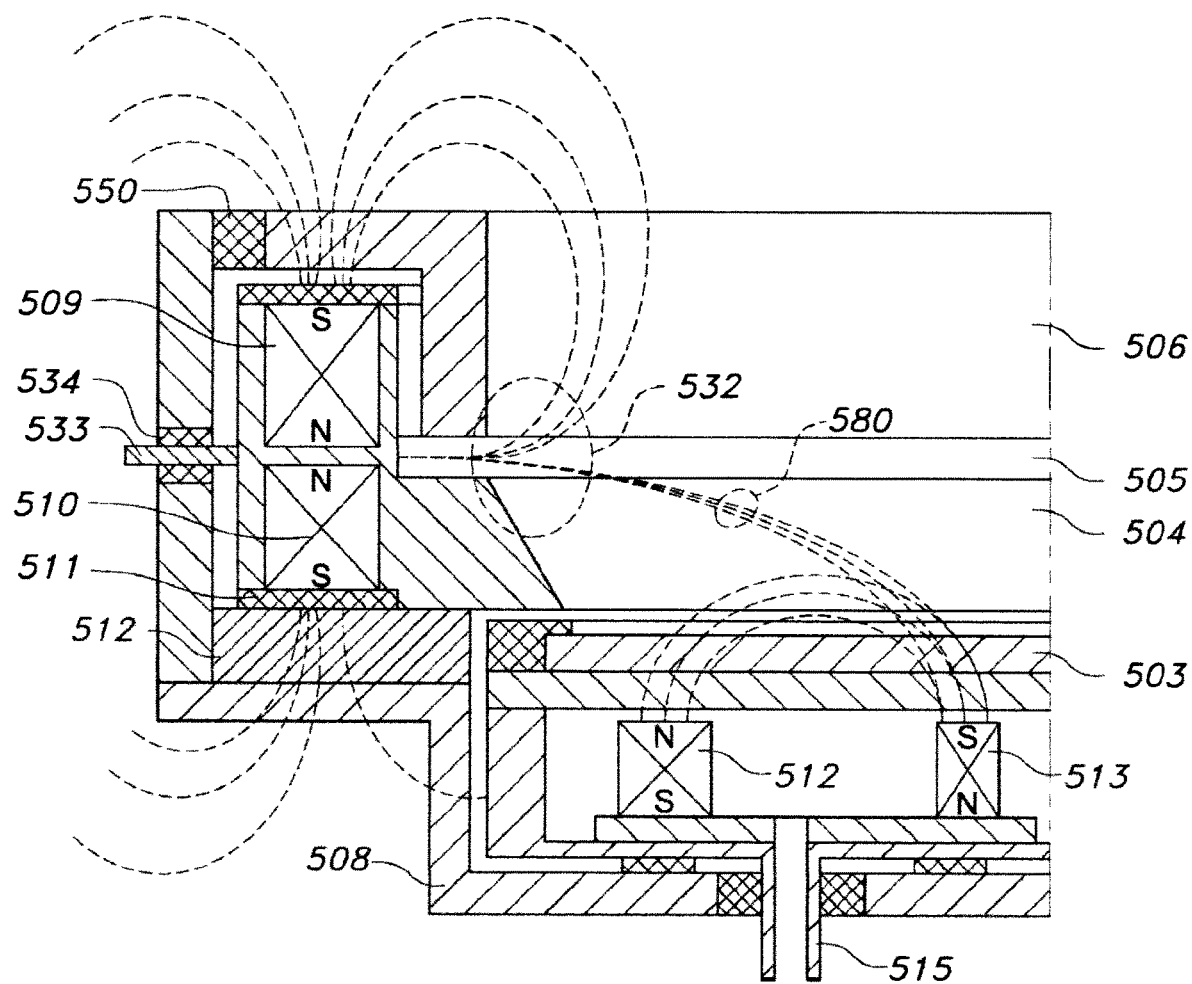
FIG. 14 shows an illustrative cross-sectional view of an embodiment of an electrically and magnetically enhanced I-PVD unbalanced magnetron sputtering source, in which the cathode magnet assembly is unbalanced from the center.

FIG. 14 shows an embodiment in which the cathode 503 magnet assembly forms a magnetron configuration. (Please describe reference numeral 580) Magnet 513 and magnets 509, 510 are magnetically coupled to each other. Magnets 509, 510 and 513 form magnetic field lines that are substantially parallel to the cathode 503 surface. This configuration can be used for sputtering applications. Cathode 503 can be powered with different power supplies through water inlet 515. In this configuration, electrode 504 can be powered or grounded, and anode 506 can be powered or grounded, as shown in FIGS. 10 and 12.

Figure 15A:
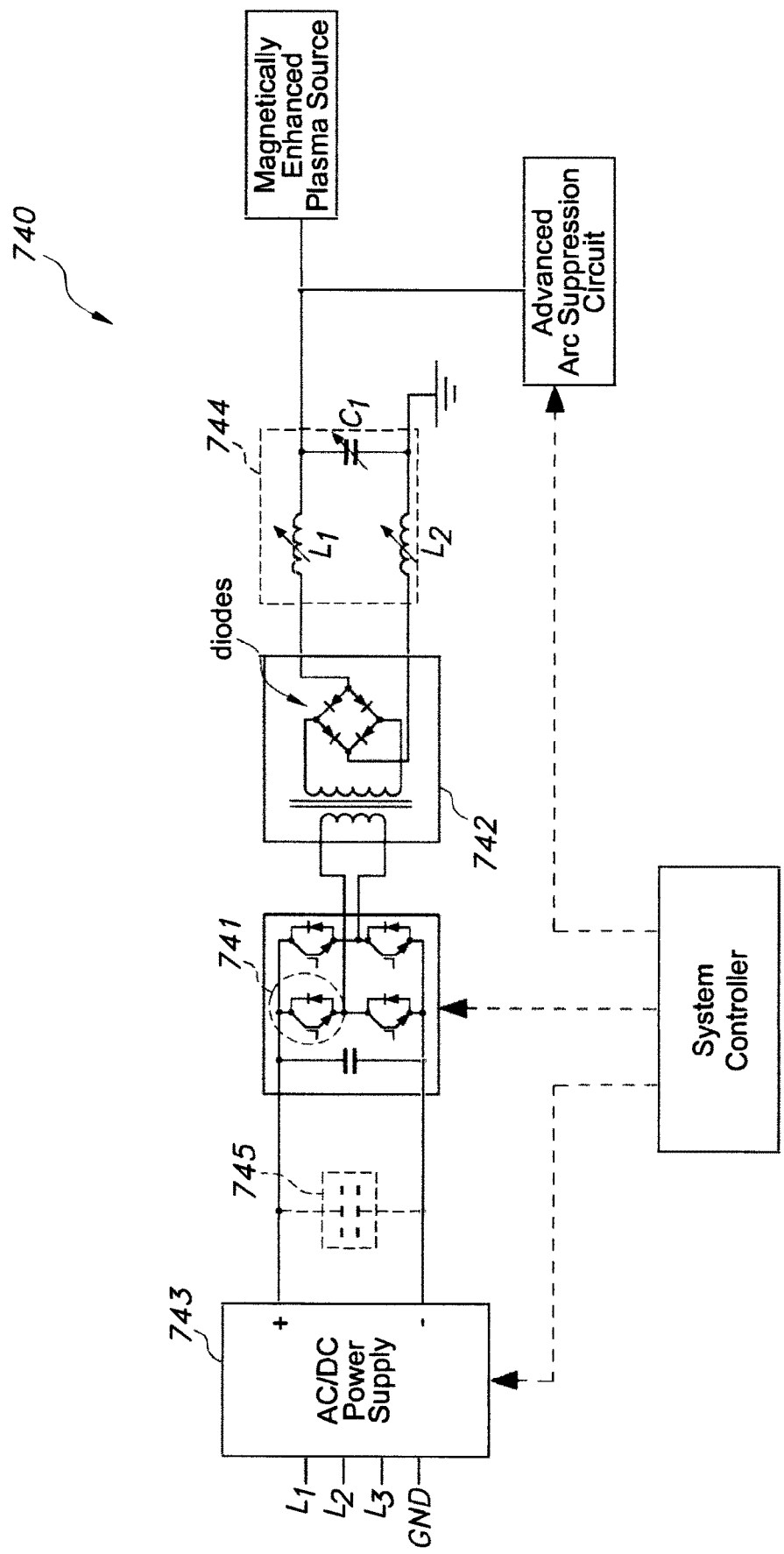
FIG. 15 (a) shows an illustrative block diagram of an asymmetrical bipolar pulse power supply.
Figure 16:
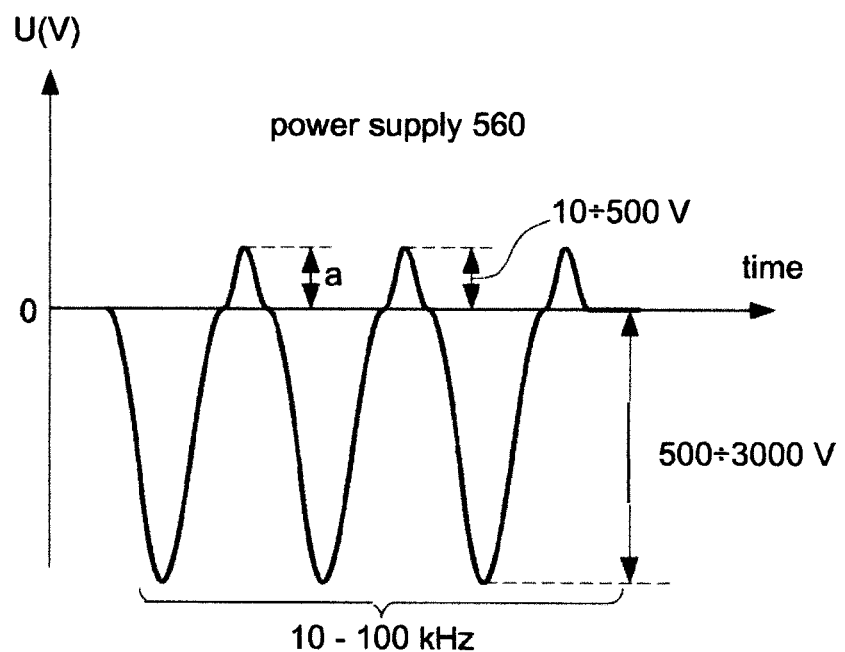
FIG. 16 shows a timing diagram of bipolar voltage pulses that can be generated using an asymmetrical bipolar pulse power supply.
Figure 16:
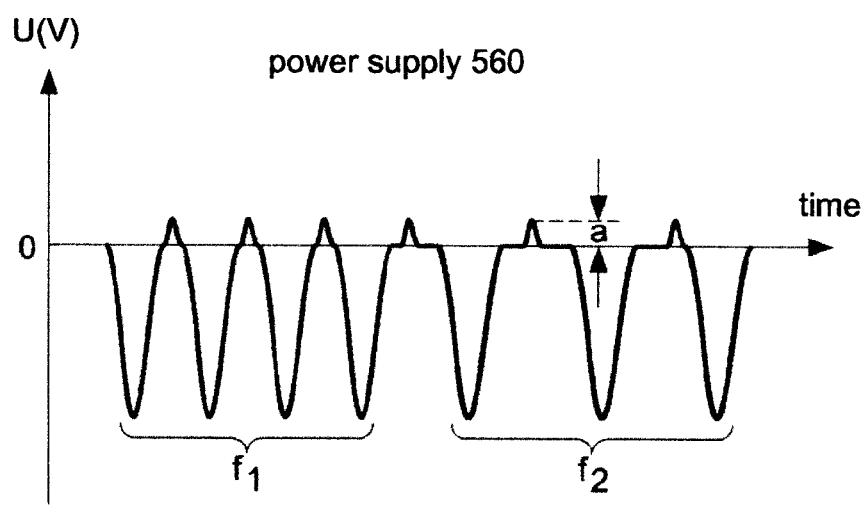

The power supply 560 can be a power supply that generates asymmetrical bipolar pulses as described above. FIG. 15(a) shows a block diagram 740 of the pulsed power supply 560. This power supply can generate asymmetrical voltage pulses as shown in FIG. 16. These pulses can have a frequency in a range of 10-100 KHz. The amplitude can be in a range of 500-3000 V for negative voltage and 10-500 V for positive voltage. These pulses can be packaged in one burst. The duration of the burst can be in a range of 1-50 ms. During one burst, the discharge power density on the cathode can be in a range of 0.1-10 kW/cm$^2$. One burst can have voltage pulses with different amplitude and/or frequency.

Figure 15B:
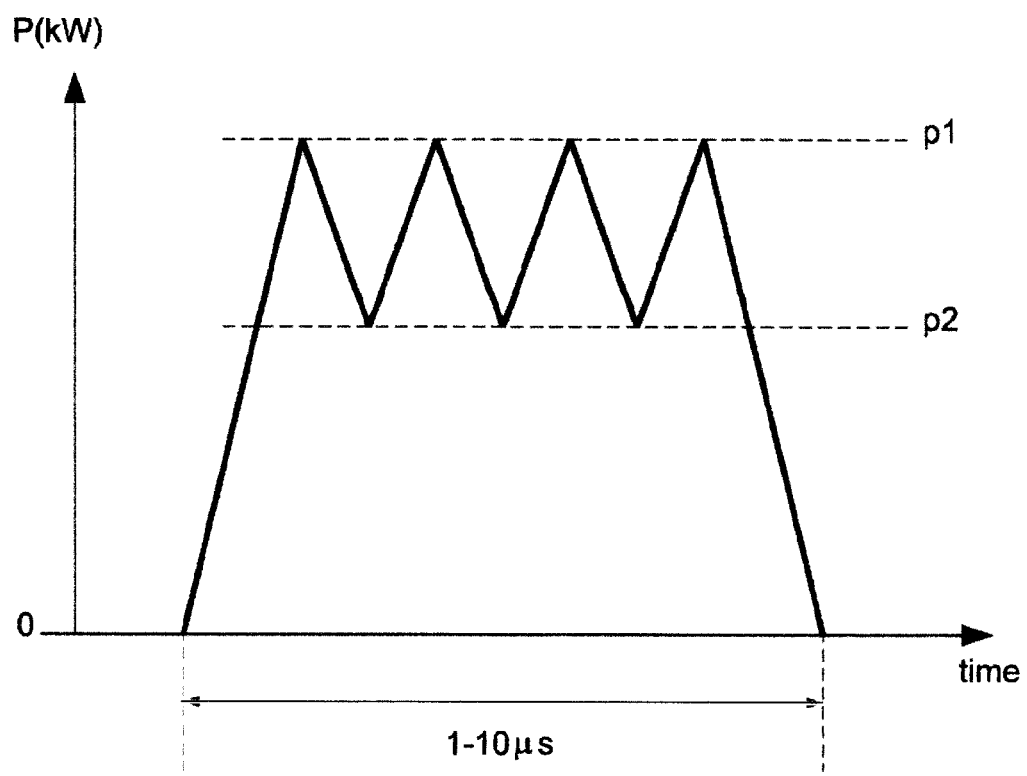

DC power supply 703 charges a capacitor bank 745 that is connected to an H-bridge. The H-bridge includes four (4) solid state switches 741. The H-bridge is connected to a pulse transformer 742 and pulse former network 744. Pulse former network 744 includes variable inductors L1, L2 and variable capacitor C1. By adjusting L1, L2, and C1, the value of the positive voltage amplitude "a" from the asymmetrical voltage pulse, as shown in FIG. 16, can be controlled. The values of the inductors L1 and L2 can be in the range of 1-200 μH. The value of the capacitor C1 can be in the range of 0.01-10 μF. In an embodiment, the block diagram 740 of the power supply 560 can have multiple H-bridges and multiple pulse transformers that can generate different voltage amplitudes in one burst. In an embodiment, the block diagram 740 of the power supply 560 can have two (2) output LC circuits. By switching the out LC circuits, the power supply can generate differently shaped output voltage pulses and, therefore, power pulses. In an embodiment, the power supply 560 generates power pulse as shown in FIG. 15 (b). The power supply controls P1 and P2 at fixed power oscillations frequency. The frequency can be in the range of 10-60 kHz. P1 can exceed P2 by a factor of two (2) to ten (10). In an embodiment, P1 can exceed P2 by a factor of two (20).

Figure 17:
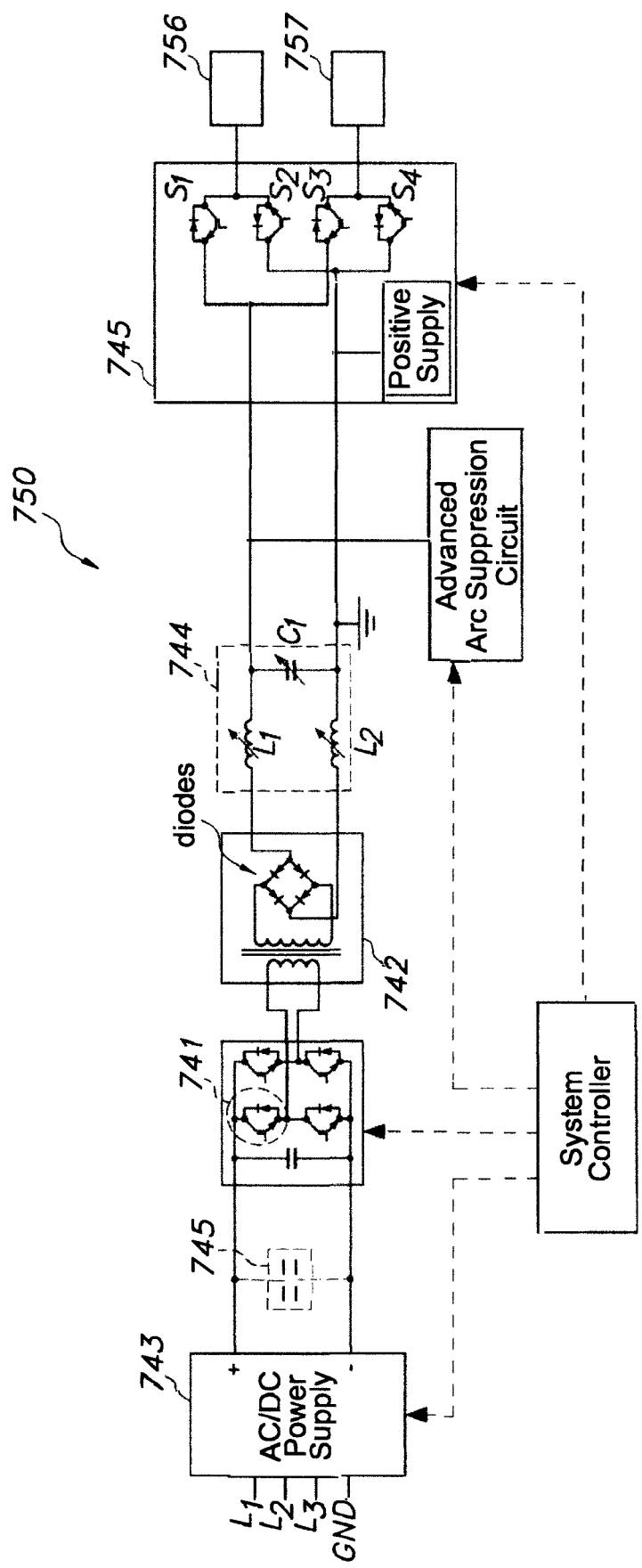
FIG. 17 shows an illustrative block diagram of the asymmetrical bipolar pulse power supply with two output signals.

In an embodiment, power supply 560 can be connected between cathode 503 and electrode 504 from the electrically and magnetically enhanced I-PVD unbalanced magnetron sputtering sources. In this case, periodically, the cathode 503 and the electrode 504 from the electrically and magnetically enhanced I-PVD unbalanced magnetron sputtering sources can be positive or negative. The block diagram 750 of such a power supply is shown in FIG. 17. When switches S1 and S4 are closed and switches S2 and S3 are opened, electrode 756 has a negative potential and electrode 757 has a positive (ground) potential. When switches S1 and S4 are opened and switches S2 and S3 are closed, electrode 756 has a positive (ground) potential and electrode 757 has a negative potential.

Figure 18:
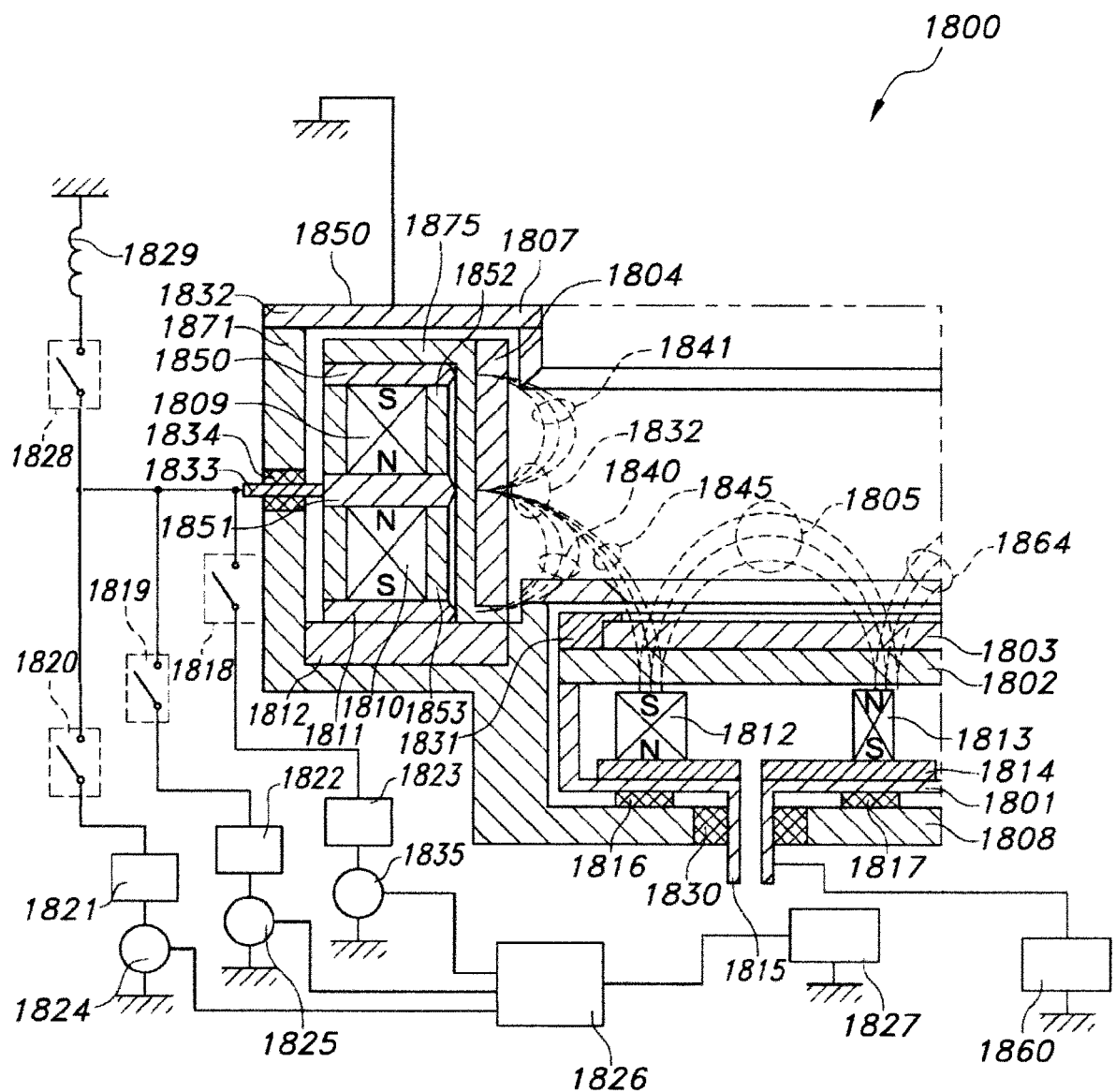
FIG. 18 shows an illustrative cross-sectional view of an embodiment of an electrically and magnetically enhanced I-PVD unbalanced magnetron sputtering source with two cathode targets.

FIG. 18 shows another embodiment 1800 of the magnetically and electrically enhanced magnetron I-PVD plasma source for deposition. The plasma source 1800 includes two magnetrons positioned adjacent to each other. One magnetron has a round target and the other magnetron has a ring-shaped target positioned around the round target. The round magnetron includes a cusp magnetic field geometry on a cathode target surface. The cusp magnetic field can form one or two race tracks on the ring cathode target surface. The cusp magnetic field provides magnetic coupling between the round target and the ring-shaped target. The magnetic coupling can be between the ring-shaped cathode target and an edge or center of the magnetron configuration positioned behind the round target. A primary purpose of the ring magnetron includes providing energetic electrons for discharge on the round magnetron in order to increase the degree of ionization of sputtered target material atoms from the round cathode target. During operation, the electrons formed by gas discharge on the ring-shaped cathode target drift towards the round cathode target and increase plasma density near the round cathode target. In an embodiment, the ring magnetron is connected to a high voltage pulse power supply or high power pulse power supply that can generate current density on the ring-shaped cathode target in the range of 0.1-3.0 A/cm2 In an embodiment, voltage pulse duration is in a range of 3-200 μs and frequency is in a range of 200 Hz-200 KHz. In an embodiment voltage pulse duration is in the range of 1000 μs and 10000 μs. In an embodiment, voltage pulse frequency is in the range of 1 Hz and 200 Hz. Pulse voltage amplitude is in a range of 500-3000V. In an embodiment, a high power pulse power supply can generate voltage pulses with durations between 1 ms and 20 ms. In general any power supply that can generate magnetron discharge can be connected to the ring magnetron. In an embodiment the pulse negative voltage amplitude is the range of 500 V and 3000 V. In an embodiment, a pulse power supply that generates magnetron discharge on a ring magnetron is an asymmetrical bipolar power supply. In an embodiment, the negative voltage amplitude can be in the range of 400 V and 3000 V. In an embodiment, the positive voltage amplitude can be in the range of 40 V and 500 V. At the same time, the round electrode is connected to a variable DC (direct current) power supply that can generate and sustain discharge voltage in a range of 200-700 V. The variable DC power supply can operate in power control mode or in voltage control mode. If the variable DC power supply operates in power control mode during the pulse discharge, the electrons from the ring-shaped cathode target discharge drift towards the round cathode target surface, reduce the discharge voltage, and increase the discharge current. In an embodiment, ring magnetron and round magnetron are connected to the pulse power supplies. The voltage pulses from two power supplies can be synchronized in time. In an embodiment, voltage pulses can be applied simultaneously or with time shift. In an embodiment, the duration of the voltage pulses applied to the ring magnetron is 10 times less than duration of the pulses applied to the round magnetron.

This operation is very useful, for example, for sputtering indium tin oxide (ITO) films. In this case, the round cathode target voltage, during the sputtering process, can be low and, therefore, plasma damage of the growing film is also low. Low damaged sputtered films exhibit high electrical conductivity.

The power applied to the additional magnetron ring discharge controls the degree of ionization of sputtered target material atoms from the round magnetron. Additional magnetron ring discharge can be used to perform re-sputtering of previously sputtered film on the substrate. The re-sputtering process is advantageous for forming thin film coatings inside a via or trench on a substrate. The re-sputtering process can be performed with sputtered target material ions, feed gas ions, or a combination thereof. During the re-sputtering process, the ring magnetron can be connected to a radio frequency (RF) power supply. In an embodiment, the ring magnetron inductively grounded. The plasma source 1800 can be used for chemically enhanced ionized physical vapor deposition (CE-IPVD).

The plasma source 1800 includes the round cathode target (first cathode target) 1803 positioned on top of a cover 1802 of a water jacket 1801. A clamp 1831 holds first cathode target 1803 on the cover 1802. Inside the water jacket 1801, there is a magnet assembly. The magnet assembly includes magnets 1812, 1813 and a magnetic pole piece 1814. The magnet assembly forms a magnetron configuration on the first cathode target 1803. A first anode 1806 is positioned adjacent to the round (second) cathode target 1803. The water jacket 1801 includes a water inlet 1815 and a water outlet (not shown). The water jacket 1801 is positioned inside a housing 1808. The water jacket 1801 is isolated from the housing 1808 with isolators 1816, 1817, 1830. The first anode 1806 is positioned adjacent to the cathode target 1803. The magnet assembly that includes magnets 1812, 1813 and magnetic pole piece 1814 can form a stationary, rotatable, or movable magnet assembly. The rotatable magnet assembly can rotate with speed in a range of 10-500 revolutions per minutes. The first cathode target 1803 is formed in the shape of a disk, but can be formed in other shapes, such as a rectangle, and the like. The cathode target 1803 material can be conductive, semi-conductive, and/or non-conductive. The following chemical elements, or their combination, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode target material.

A ring cathode target (second cathode target) 1804 is positioned adjacent to the first cathode target 1803. The second cathode target 1804 is attached to a copper water jacket 1875. A second anode 1807 is positioned adjacent to the second cathode target 1804. The magnets 1809, 1810 are positioned in the housing 1852, 1853, and form a cusp magnetic field 1832 and magnetron configuration 1840 1841. There are three magnetic pole pieces 1811, 1851 and 1850 that form magnetic fields 1841, 1840, and 1832, respectively. The pole pieces 1851, 1850, and 1811 concentrate magnetic field lines. A pole piece 1851 and, therefore, the second cathode target 1804 are electrically connected to electrode connector 1833. Electrode connector 1833 is electrically isolated from the housing 1871 with isolator 1834. The magnets 1809, 1810 face the same polarity, north-north or south-south. The magnetic field lines 1845 provide magnetic coupling between cusp magnetic field 1832 and magnetron configuration field lines 1805 positioned behind the target 1803. Electrode connector 1833 is isolated from side cover 1871 by isolator 1834. Switches 1828, 1820, 1819, and 1818 are operatively connected to controller 1826 and computer 1827.

The second cathode target 1804 is connected to power supplies 1824, 1825, 1835 and matching networks 1821, 1822, and 1823 through switches 1820, 1819, 1818. Power supplies 1824, 1825, and 1835 are connected to controller 1826 and computer 1827. The second cathode target 1804 can be grounded through switch 1828 and inductor 829 to control negative voltage bias formed by RF discharge. Power supplies 1824, 1825, 1835 can be RF (radio frequency) or VHF (very high frequency) power supplies. For example, power supply 1824 can be a power supply that generates voltage with a frequency of 13.56 MHz. Power supply 1825 can be a power supply that generates voltage with a frequency of 27 MHz. Power supply 1835 can be a power supply that generates a voltage with a frequency of 60 MHz. The power range of these power supplies can be in the range of 1-10 KW.

The second cathode target 1804 is formed in the shape of a ring, but can be formed in other shapes. The first cathode target 803 material can be conductive, semi-conductive, and/or non-conductive. In an embodiment, the second cathode target 1804 can be a combination of conductive and non-conductive material. The following chemical elements, or their combination, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode target material.

In an embodiment, one of power supplies 1824, 1825, 1835 can be a pulse power supply. Pulse power supplies can generate symmetrical or asymmetrical bipolar voltage pulses. Pulse power supply can generate negative voltage pulses. The amplitude of a negative voltage in an asymmetrical voltage pulse can be in a range of 100-3000 V. The amplitude of a positive voltage in an asymmetrical voltage pulse can be in a range of 10-1000 V. In an embodiment, one of power supplies 1824, 1825, 1835 can be a pulse power supply that generates unipolar negative voltage pulses. In an embodiment, an AC (alternating current) power supply is connected between the cathode targets 1803 and 1804.

The first cathode target 1803 is connected to power supply 1860 through water jacket 1801 and water inlet 1815. Power supply 1860 can be an RF power supply that generates voltage with frequency in a range of 100 KHz-60 MHz. In an embodiment, the power supply 1860 can be a pulse power supply. The pulse power supply can generate symmetrical or asymmetrical bipolar voltage pulses. The pulse power supply can generate negative voltage pulses. The amplitude of a negative voltage in asymmetrical voltage pulses can be in a range of 100-3000 V. The amplitude of a positive voltage in asymmetrical voltage pulses can be in a range of 10-1000 V.

Figure 19:
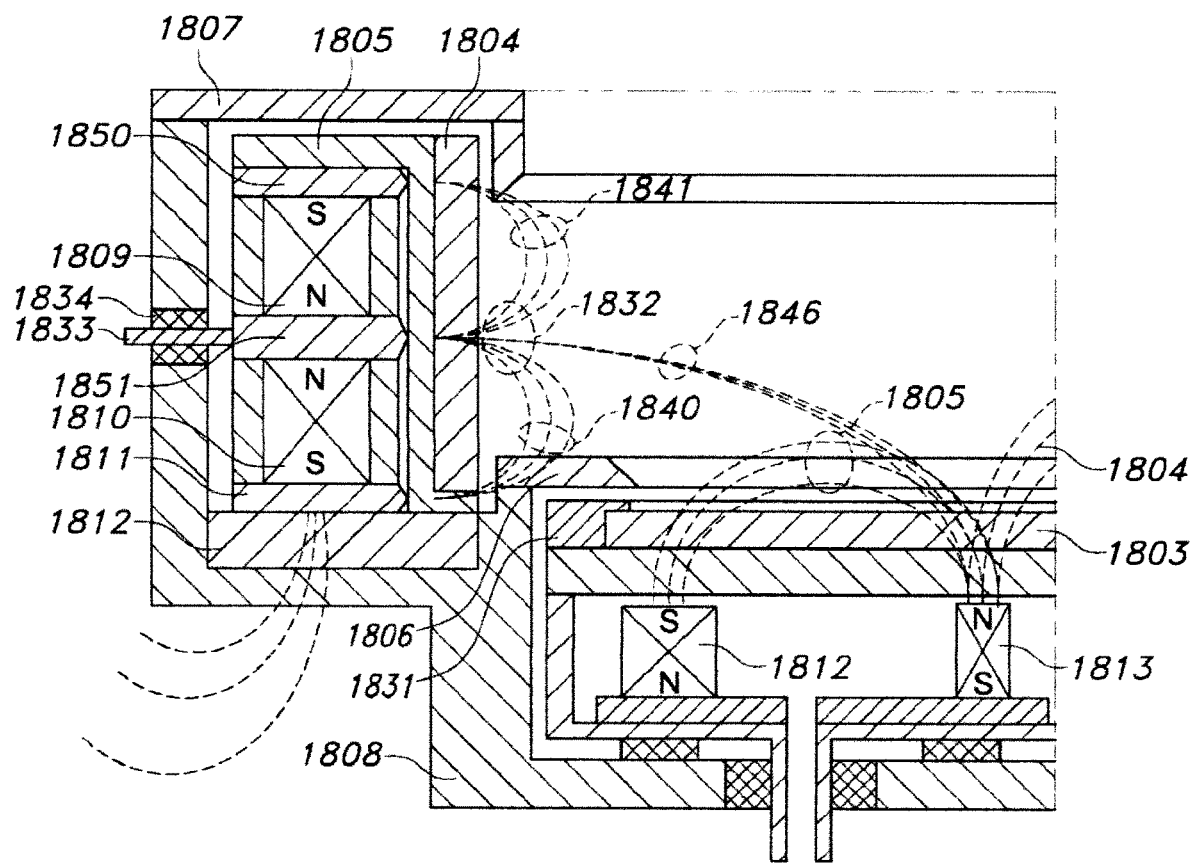
FIG. 19 shows an illustrative cross-sectional view of an embodiment of an electrically and magnetically enhanced I-PVD unbalanced from the center magnetron sputtering source with two cathode targets.

FIG. 19 shows magnetic field lines 1846 that provide magnetic coupling between the center of the first cathode target 1803 magnetron configuration and the cusp magnetic field lines 1832 on the second cathode target 1804.

Figure 20:
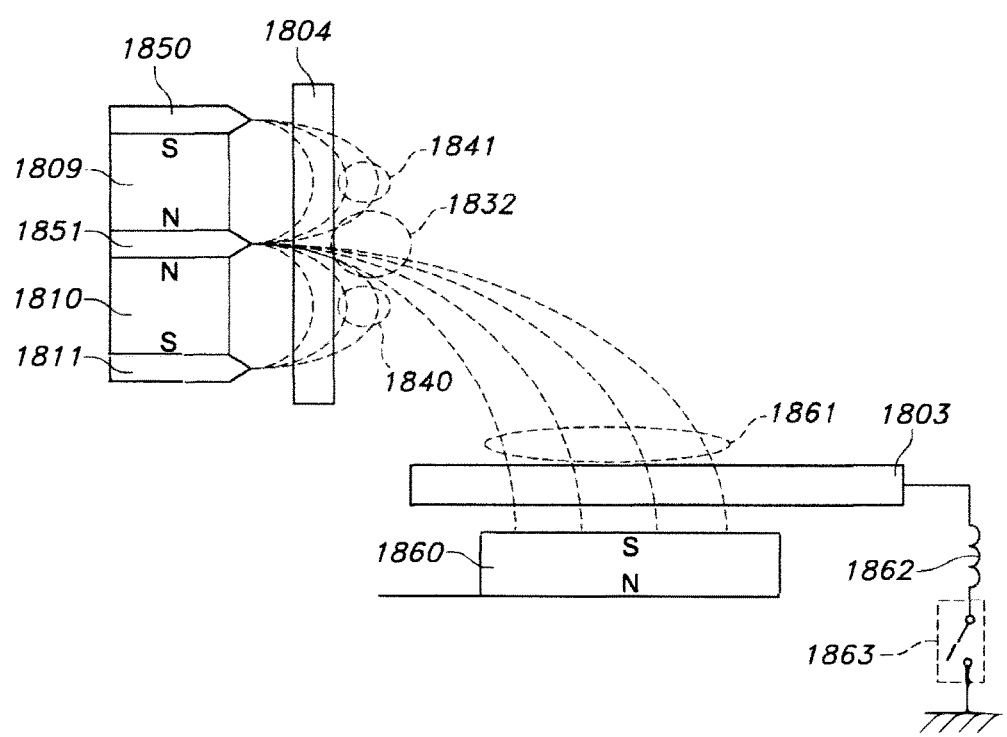
FIG. 20 shows an illustrative cross-sectional view of an embodiment of an electrically and magnetically enhanced I-PVD unbalanced plasma source with two cathode targets.

FIG. 20 shows an embodiment in which the first cathode target 1803 magnet assembly does not form a magnetron configuration. Magnet 860 forms magnetic field lines substantially perpendicular to a surface of the first cathode target 1803. This configuration can be used for CVD, RIE, sputter etching, and sputtering applications. The first cathode target 1803 can be powered with different power supplies through water inlet 1815. Cathode 1803 can be inductively grounded through inductor 1862 and switch 1863. In this configuration, the second cathode target 1804 can be powered and inductively grounded through inductor 1829 and switch 1828.

The plasma source 1800 can be configured as an arc or sputtering source. In this case, arc discharge can be formed on the round first cathode target, and magnetron discharge can be formed on the ring cathode target. The cusp magnetic field provides magnetic coupling between the ring cathode target and the round cathode target. The electrons generated by magnetron discharge on the ring cathode target drift towards round cathode target. These electrons have an effect on the movement and size of arc spots. The arc discharge can be generated by applying DC power, pulse power, or a combination thereof. The magnetron discharge can also be pulse discharge. The voltage pulses applied to the ring cathode target to generate magnetron discharge can be synchronized with voltage pulses applied to the round cathode target to generate or sustain arc discharge, which can be synchronized. The magnet assembly positioned under the round cathode target can be stationary, rotatable, or movable.

Figure 21:
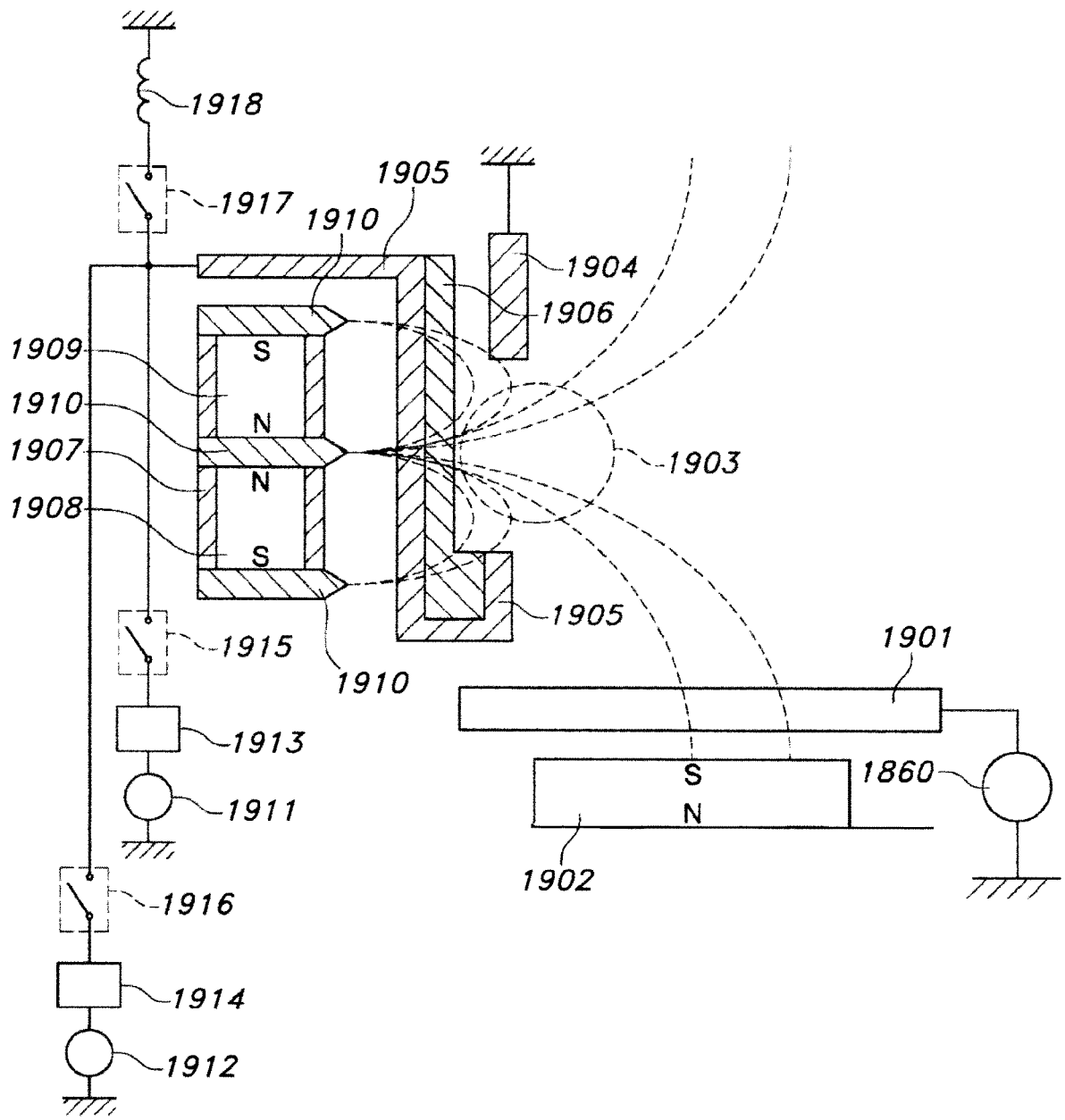
FIG. 21 shows an illustrative cross-sectional view of an embodiment of an electrically and magnetically enhanced I-PVD unbalanced plasma source with two cathode targets, in which one target is made from dielectric material.

FIG. 21 shows an embodiment in which the second cathode target has a more complex form. Magnets 1909, 1908 and pole piece 1910 form a cusp magnetic field 1903. Magnets 1909, 19078 are positioned inside a housing 1907. A dielectric target 1906 is positioned on the cathode target holder 1905. The cathode target holder 1905 is operatively connected to RF power supplies 1912, 1911 through matching networks 1914, 1913 and switches 1916, 1915. The cathode target holder 1905 can be inductively grounded through switch 1917 and inductor 1918. The RF discharge is generated between anode 1904, dielectric target 906, and cathode target holder 1905. In this design, the electrons that drift from the first cathode target 1901 towards the surface of second cathode target 1906 cannot escape to the ground through switch 1917 and inductor 1918 if target holder 1905 and second cathode target 1905 are inductively grounded. In an embodiment, target holder 1905 made from electrically conductive material.

The magnetically and electrically enhanced magnetron I-PVD plasma source for sputtering and re-sputtering processes can be positioned inside a vacuum chamber to form an electrically enhanced magnetron I-PVD plasma apparatus for sputtering and re-sputtering processes.

The magnetically and electrically enhanced magnetron I-PVD plasma source for sputtering and re-sputtering processes includes the following: a first cathode target assembly connected to a matching network and RF power supply, pulsed RF power supply, pulse power supply, or DC power supply; an anode connected to ground; a second magnetron assembly including a second cathode target positioned around the first cathode target assembly connected to a matching network and RF power supply, pulsed RF power supply, pulse power supply, or DC power supply; a second anode; and two rows of permanent magnets or electromagnets that are positioned on top of each other and face the same direction to generate a cusp magnetic field on the second cathode target surface such that at least a portion of the magnetic field lines provides magnetic coupling between first cathode target and second cathode target.

The magnetically and electrically enhanced magnetron I-PVD plasma source for sputtering and re-sputtering may include the following: a first pole piece between two rows of magnets that form a cusp magnetic field; a second pole piece positioned on top of a top row of the magnets; a circuit connected between the second cathode target assembly and ground which includes at least one inductor; and a circuit connected between the first cathode target assembly and ground which includes at least one inductor.

The magnetically and electrically enhanced magnetron I-PVD deposition apparatus for sputtering and re-sputtering includes the following: a magnetically and electrically enhanced magnetron I-PVD plasma source; a vacuum chamber; a substrate holder; a substrate; a feed gas mass flow controller; and a vacuum pump.

The magnetically and electrically magnetron I-PVD deposition apparatus for sputtering and re-sputtering may include the following: a magnetically and electrically enhanced magnetron I-PVD plasma source; an RF substrate bias power supply and a matching network; a substrate heater; controller; computer; a gas activation source; and an ion source.

A method of providing magnetically and electrically enhanced magnetron I-PVD deposition includes positioning a magnetically and electrically enhanced magnetron I-PVD plasma source inside a vacuum chamber; positioning a substrate on a substrate holder; applying a first voltage from an RF power supply, pulse power supply, or DC power supply to the first cathode target to form and sustain first magnetron plasma; applying second voltage from the RF power supply, pulse power supply, or DC power supply to the second cathode target to form and sustain second magnetron plasma; providing feed gas; and depositing a layer of target material on the substrate surface.

The method of providing magnetically and electrically enhanced magnetron I-PVD deposition may include the following: applying a negative bias to the substrate; applying heat to the substrate; passing feed gas through the gas activation source; passing feed gas through the ion source; connecting a second cathode target to a ground electric potential through at least one inductor; and rotating the magnetic field lines crossing the first cathode target surface.

A method of providing magnetically and electrically enhanced magnetron I-PVD sputter etching with feed gas and sputtered target material atom ions may include the following: positioning a magnetically and electrically enhanced I-PVD plasma source inside a vacuum chamber; positioning a substrate on the substrate holder; applying a first voltage from an RF power supply, pulse power supply, or DC power supply to the first cathode target to form and sustain first magnetron plasma; applying a second voltage from the RF power supply to the second cathode target to form and sustain second magnetron plasma; connecting a second cathode target to ground through the circuit that has at least one inductor to control RF voltage bias on the second cathode target; applying RF power to the substrate holder to generate negative substrate voltage bias; and sputter etching the target material from the substrate surface.

A method of providing magnetically and electrically enhanced magnetron I-PVD sputter etching with feed gas and sputtered target material ions may include applying heat to the substrate; passing feed gas through a gas activation source, and rotating magnetic field lines crossing the first cathode target surface.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A method for depositing a layer on a substrate using an electrically and magnetically enhanced ionized physical vapor deposition (I-PVD) unbalanced magnetron sputtering apparatus, the method comprising:

disposing a first cathode target assembly inside a vacuum chamber, the first cathode target assembly comprising the unbalanced magnetron;

positioning a second cathode assembly concentrically with respect to the first cathode target assembly inside the vacuum chamber, the second cathode assembly comprising an anode, a gap electrode, a first magnet, and a second magnet, the anode positioned such that a gap is formed between the anode and the gap electrode, the first magnet and the second magnet each comprising a ring shape, the first magnet comprising a first pole surface having only a single polarity, the second magnet comprising a second pole surface having only a single polarity, the first pole surface being substantially parallel to the second pole surface, the single polarity of the first pole surface being the same as the single polarity of the second pole surface, the first pole surface facing the second pole surface, the first pole surface disposed adjacent to the second pole surface, thereby causing a cusp magnetic field in the gap;

coupling a radio frequency power supply to the second cathode assembly;

coupling a pulsed power supply to the first cathode target assembly;

coupling an inductor between the second cathode assembly and ground; and coupling the inductor to a connector, the connector separated from a cylindrical shield by a first isolator, the cylindrical shield disposed around the anode and the gap electrode, the cylindrical shield separated from the anode by a second isolator, the cylindrical shield separated from the gap electrode by a third isolator.

2. The method, as defined by claim 1, wherein the anode and gap electrode cause a plurality of electric field lines in the gap, the first magnet and the second magnet causing a plurality of magnetic field lines in the gap, at least a portion of the plurality of electric field lines in the gap being substantially perpendicular to at least a portion of the magnetic field lines in the gap.

3. The method, as defined by claim 1, wherein the anode and gap electrode cause a plurality of electric field lines in the gap, the first magnet and the second magnet causing a plurality of magnetic field lines in the gap, at least a portion of the plurality of electric field lines in the gap being substantially parallel to at least a portion of the plurality of magnetic field lines in the gap.

4. The method, as defined by claim 1, wherein the anode and gap electrode cause a plurality of electric field lines in the gap, the first magnet and the second magnet causing a plurality of magnetic field lines in the gap, at least a first portion of the plurality of electric field lines in the gap being substantially perpendicular to at least a first portion of the plurality of magnetic field lines in the gap simultaneously with at least a second portion of the plurality of electric field lines in the gap being substantially parallel to at least a second portion of the plurality of magnetic field lines in the gap.

5. The method, as defined by claim 1, further comprising positioning a substrate holder in the vacuum chamber.

6. The method, as defined by claim 5, further comprising coupling a substrate bias voltage to the substrate holder, the substrate bias voltage comprising a range of −10V to −200 V.

7. The method, as defined by claim 1, wherein the first cathode target assembly comprises a round shape.

8. The method, as defined by claim 1, wherein the second cathode assembly comprises a ring shape.

9. The method, as defined by claim 1, further comprising providing a feed gas, the feed gas comprising a mixture of a noble gas and a gas comprising atoms of the first cathode target assembly.

10. The method, as defined by claim 1, wherein power applied to the first cathode target assembly and power applied to the second cathode assembly are synchronous.

11. An electrically and magnetically enhanced ionized physical deposition (I-PVD) unbalanced magnetron sputtering apparatus that deposits a layer on a substrate, the apparatus comprising:
a first cathode target assembly configured to be disposed inside a vacuum chamber, the first cathode target assembly comprising the unbalanced magnetron;
a second cathode assembly configured to be positioned concentrically with respect to the first cathode target assembly inside the vacuum chamber, the second cathode assembly comprising an anode, a gap electrode, a first magnet, and a second magnet, the anode positioned such that a gap is formed between the anode and the gap electrode, the first magnet and the second magnet each comprising a ring shape, the first magnet comprising a first pole surface having only a single polarity, the second magnet comprising a second pole surface having only a single polarity, the first pole surface being substantially parallel to the second pole surface, the single polarity of the first pole surface being the same as the single polarity of the second pole surface, the first pole surface facing the second pole surface, the first pole surface disposed adjacent to the second pole surface, thereby causing a cusp magnetic field in the gap;
a radio frequency power supply coupled to the second cathode assembly;
a pulsed power supply coupled to the first cathode target assembly; and
an inductor coupled between the second cathode assembly and ground, wherein the inductor is coupled to a connector, the connector separated from a cylindrical shield by a first isolator, the cylindrical shield disposed around the anode and the gap electrode, the cylindrical shield separated from the anode by a second isolator, the cylindrical shield separated from the gap electrode by a third isolator.

12. The apparatus, as defined by claim 11, wherein the anode and gap electrode cause a plurality of electric field lines in the gap, the first magnet and the second magnet causing a plurality of magnetic field lines in the gap, at least a portion of the plurality of electric field lines in the gap being substantially perpendicular to at least a portion of the plurality of magnetic field lines in the gap.

13. The apparatus, as defined by claim 11, wherein the anode and gap electrode cause a plurality of electric field lines in the gap, the first magnet and the second magnet causing a plurality of magnetic field lines in the gap, at least a portion of the plurality of electric field lines in the gap being substantially parallel to at least a portion of the plurality of magnetic field lines in the gap.

14. The apparatus, as defined by claim 11, wherein the anode and gap electrode cause a plurality of electric field lines in the gap, the first magnet and the second magnet causing a plurality of magnetic field lines in the gap, at least a first portion of the plurality of electric field lines in the gap being substantially perpendicular to at least a first portion of the plurality of magnetic field lines in the gap simultaneously with at least a second portion of the plurality of electric field lines in the gap being substantially parallel to at least a second portion of the plurality of magnetic field lines in the gap.

15. The apparatus, as defined by claim 11, further comprising a substrate holder configured to be disposed within the vacuum chamber.

16. The apparatus, as defined by claim 15, wherein the substrate holder is operatively coupled to a substrate bias voltage comprising a range of −10 V to −200 V.

17. The apparatus, as defined by claim 11, wherein the first cathode target assembly comprises a round shape.

18. The apparatus, as defined by claim 11, wherein the second cathode assembly comprises a ring shape.

19. The apparatus, as defined by claim 11, further comprising a feed gas, the feed gas comprising a mixture of a noble gas and a gas comprising atoms of the first cathode target assembly.

20. The apparatus, as defined by claim 11, wherein power applied to the first cathode target assembly and power applied to the second cathode assembly are synchronous.

21. The method, as defined by claim 1, wherein the inductor is electrically coupled to the gap electrode.

22. The apparatus, as defined by claim 11, wherein the inductor is electrically coupled to the gap electrode.

* * * * *